(12) United States Patent
Kim et al.

(10) Patent No.: US 12,302,717 B2
(45) Date of Patent: May 13, 2025

(54) PIXEL AND DISPLAY DEVICE HAVING THE SAME

(71) Applicant: Samsung Display Co., LTD., Yongin-si (KR)

(72) Inventors: Keun Woo Kim, Yongin-si (KR); Sang Sub Kim, Yongin-si (KR); Hye Na Kwak, Yongin-si (KR); Doo Na Kim, Yongin-si (KR); Thanh Tien Nguyen, Yongin-si (KR); Yong Su Lee, Yongin-si (KR); Jae Hwan Chu, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 100 days.

(21) Appl. No.: 16/857,888

(22) Filed: Apr. 24, 2020

(65) Prior Publication Data

US 2021/0057502 A1 Feb. 25, 2021

(30) Foreign Application Priority Data

Aug. 20, 2019 (KR) .......................... 10-2019-0101682

(51) Int. Cl.
*H10K 59/131* (2023.01)
*G09G 3/3233* (2016.01)
(Continued)

(52) U.S. Cl.
CPC .......... *H10K 59/131* (2023.02); *G09G 3/3233* (2013.01); *G09G 3/3266* (2013.01); *G09G 3/3291* (2013.01); *G09G 2320/0233* (2013.01)

(58) Field of Classification Search
CPC ............. H01L 27/3276; H01L 27/3262; H01L 27/124; H01L 27/3244; H01L 27/3248
See application file for complete search history.

(56) References Cited

U.S. PATENT DOCUMENTS

| 7,477,218 B2 | 1/2009 | Koga et al. |
| 9,859,334 B2 | 1/2018 | Kim et al. |

(Continued)

FOREIGN PATENT DOCUMENTS

| CN | 105321957 | 2/2016 |
| CN | 107275368 | 10/2017 |

(Continued)

OTHER PUBLICATIONS

Keunwoo Kim, et al., "Double-Gate CMOS: Symmetrical-Versus Asymmetrical-Gate Devices", IEEE Transactions on Electron Devices, Feb. 2001, pp. 294-299, vol. 48, No. 2.

(Continued)

*Primary Examiner* — Tony Tran
(74) *Attorney, Agent, or Firm* — KILE PARK REED & HOUTTEMAN PLLC

(57) ABSTRACT

A display device includes pixels at least one of which includes a light emitting element connected between a first power source and a second power source, a first transistor connected between the first power source and the light emitting element and controlling a driving current flowing through the light emitting element in response to a voltage of a first node, a switching transistor connected to the first node and including and active layer that includes first and second conductive regions spaced apart from each other, first and second channel regions disposed between the first and second conductive regions, and a common conductive region disposed between the first and second channel regions, and a conductive pattern overlapping the active layer to face the common conductive region.

20 Claims, 24 Drawing Sheets

(51) Int. Cl.
*G09G 3/3266* (2016.01)
*G09G 3/3291* (2016.01)

(56) References Cited

U.S. PATENT DOCUMENTS

| | | | |
|---|---|---|---|
| 9,934,723 B2 | 4/2018 | Lee et al. | |
| 9,991,287 B2 | 6/2018 | Lim et al. | |
| 10,586,836 B2 | 3/2020 | Bae et al. | |
| 11,335,749 B2 | 5/2022 | Kim et al. | |
| 2003/0143377 A1* | 7/2003 | Sano | H01L 29/78645 428/156 |
| 2011/0147754 A1 | 6/2011 | Isa et al. | |
| 2015/0379923 A1* | 12/2015 | Lee | H01L 27/3272 345/82 |
| 2017/0053591 A1 | 2/2017 | Seo et al. | |
| 2017/0373094 A1 | 12/2017 | Park et al. | |
| 2018/0158406 A1 | 6/2018 | Kim et al. | |

FOREIGN PATENT DOCUMENTS

| | | |
|---|---|---|
| CN | 108400148 | 8/2018 |
| JP | 2005-157262 | 6/2005 |
| KR | 10-0546707 | 1/2006 |
| KR | 10-0549761 | 2/2006 |
| KR | 10-2017-0126535 | 11/2017 |
| KR | 10-2017-0134903 | 12/2017 |
| KR | 10-2019-0079856 | 7/2019 |

OTHER PUBLICATIONS

Keunwoo Kim, et al., "Off-State Current and Performance Analysis for Double-Gate CMOS With Non-Self-Aligned Back Gate", IEEE Transactions on Electron Devices, Sep. 2005, pp. 2104-2107, vol. 52, No. 9.

Chinese Office Action for Chinese Patent Application No. 202010775416.6, dated Mar. 20, 2024.

* cited by examiner

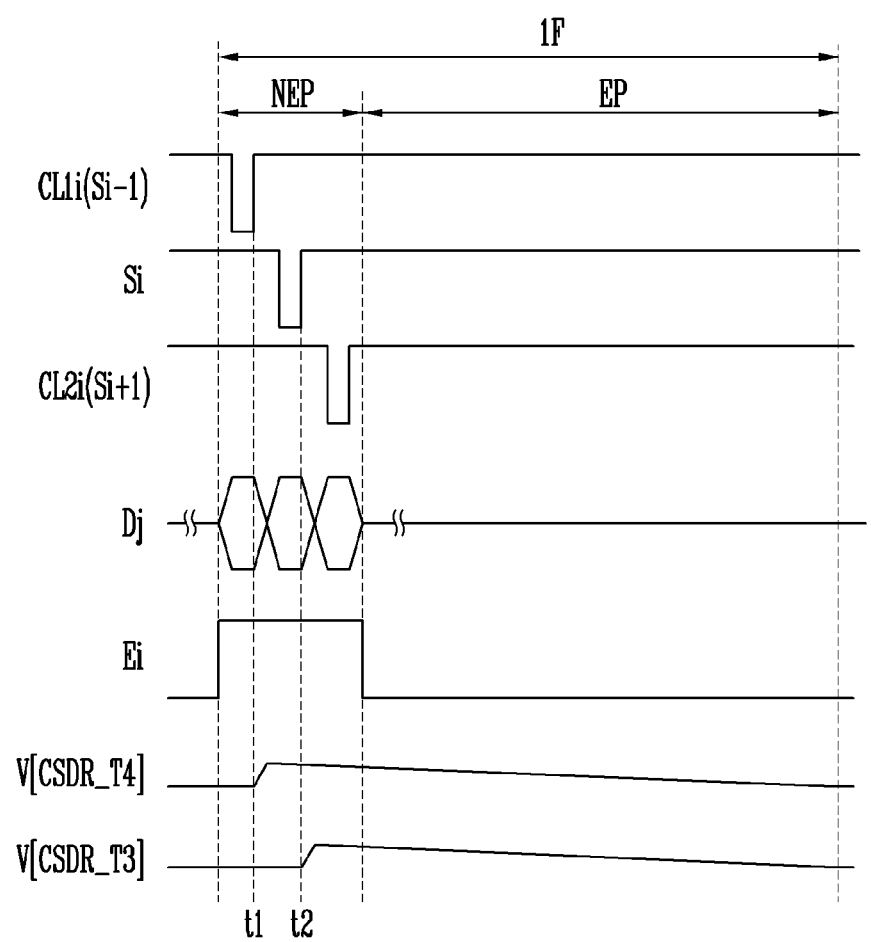

PIXEL AND DISPLAY DEVICE HAVING THE SAME

CROSS-REFERENCE TO RELATED APPLICATIONS

This application claims priority to and benefits of Korean Patent Application No. 10-2019-0101682 under 35 U.S.C. § 119, filed in the Korean Intellectual Property Office on Aug. 20, 2019, the entire contents of which are incorporated herein by reference.

BACKGROUND

1. Technical Field

Embodiments relate to a pixel and a display device having the same.

2. Description of the Related Art

A display device displays an image using pixels disposed in a display area. The pixels may be connected to respective scan lines and data lines, and may include transistors. For example, a pixel of an active light emitting display device may include a light emitting element, a driving transistor, and at least one switching transistor.

In order to express a desired luminance in the pixels during a light emission period of each frame, a gate voltage of the driving transistor is required to be stably maintained. However, a leakage current may occur in the pixel due to a characteristic of the transistors. The leakage current may cause a change in a gate voltage of the driving transistor. Therefore, the desired luminance may not be sufficiently expressed in the pixel.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments are provided for a pixel and a display device having the same capable of effectively reducing or preventing a leakage current.

A display device according to an embodiment may include a pixel disposed in a display area. The pixel may include a light emitting element connected between a first power source and a second power source, a first transistor connected between the first power source and the light emitting element and controlling a driving current flowing through the light emitting element in response to a voltage of a first node, a switching transistor connected to the first node and including an active layer. The active layer may include first and second conductive regions spaced apart from each other, a first channel region and a second channel region disposed between the first and second conductive regions, and a common conductive region disposed between the first and second channel regions. The pixel may include a conductive pattern overlapping the active layer to face the common conductive region.

In an embodiment, the conductive pattern may be disposed under the active layer to overlap the common conductive region.

In an embodiment, the conductive pattern may be disposed not to overlap the first and second conductive regions.

In an embodiment, the conductive pattern may be disposed not to overlap at least one of the first and second channel regions.

In an embodiment, the switching transistor may comprise a sub transistors including a first sub transistor and a second sub transistor connected in series with each other.

In an embodiment, the first sub transistor may include the first conductive region, the first channel region, the common conductive region, and a first gate electrode overlapping the first channel region, and the second sub transistor may include the second conductive region, the second channel region, the common conductive region, and a second gate electrode overlapping the second channel region and connected to the first gate electrode.

In an embodiment, the switching transistor may comprise at least three sub transistors connected in series with each other.

In an embodiment, the active layer may include at least two common conductive regions disposed between active layers of the at least three sub transistors, and the pixel may include at least two conductive patterns respectively overlapping the at least two common conductive regions and spaced apart from each other.

In an embodiment, the conductive pattern may have a substantially symmetrical shape with respect to the common conductive region on a line connecting the first and second conductive regions.

In an embodiment, the conductive pattern may be electrically isolated.

In an embodiment, the conductive pattern may be connected to a gate electrode of the switching transistor.

In an embodiment, the conductive pattern may be connected to a source electrode of the switching transistor.

In an embodiment, the conductive pattern may be connected to a power source.

In an embodiment, the switching transistor may include at least one of a second transistor connected between a first electrode of the first transistor and a data line and including a gate electrode connected to a scan line, a third transistor connected between a second electrode of the first transistor and the first node and including a gate electrode connected to the scan line, and a fourth transistor connected between the first node and an initialization power source and including a gate electrode connected to a first control line.

In an embodiment, the third transistor may include the common conductive region, and the conductive pattern may be disposed under the active layer of the third transistor to overlap the common conductive region.

In an embodiment, the fourth transistor may include the common conductive region, and the conductive pattern may be disposed under the active layer of the fourth transistor to overlap the common conductive region.

In an embodiment, the pixel may include a plurality of switching transistors, a predetermined number of the switching transistors may be configured of multi-structure transistors including the first and second channel regions and the common conductive region, and the conductive pattern may be disposed under the common conductive region of each of the multi-structure transistors.

A pixel according to an embodiment may include a light emitting element connected between a first power source and a second power source, a first transistor connected between the first power source and the light emitting element and controlling a driving current flowing through the light emitting element in response to a voltage of a first node, a switching transistor connected to the first node, and including an active layer that may include first and second conductive regions spaced apart from each other, a first channel region and a second channel region disposed between the first and second conductive regions, and a common conductive region disposed between the first and second channel regions, and a conductive pattern overlapping the active layer to face the common conductive region.

In an embodiment, the conductive pattern may be disposed under the active layer to be electrically isolated.

In an embodiment, the conductive pattern may be connected to a gate or source electrode of the switching transistor or a power source.

According to the pixel and the display device having the same according to embodiments, a leakage current that may occur in the switching transistor of the pixel may be effectively reduced or prevented. Therefore, grayscale expression of the pixel may be increased, and image quality of the display device may be improved.

BRIEF DESCRIPTION OF THE DRAWINGS

The above and other features of the embodiments will become more apparent by describing in further detail embodiments thereof with reference to the accompanying drawings, in which:

FIG. 3 a graphical view of signals to illustrate a driving method of the pixel PXL according to an embodiment.

DETAILED DESCRIPTION OF THE EMBODIMENTS

Figure 1:
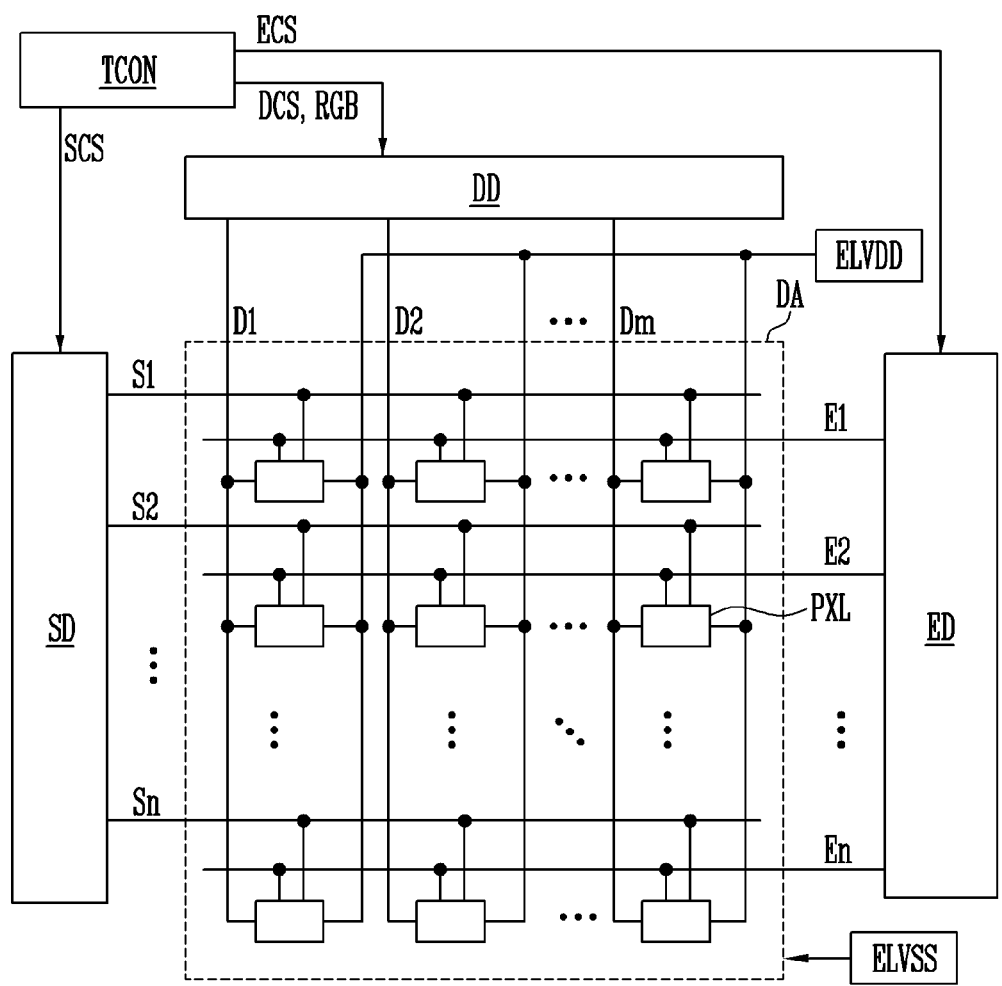
FIG. 1 illustrates a display area DA and a driving circuit of a display device according to an embodiment.

The disclosure may be modified in various ways and may have various forms, and embodiments will be illustrated in the drawings and described in detail herein. In the following description, the singular forms also include the plural forms unless the context clearly includes the singular.

The disclosure is not limited to the embodiments disclosed below, and may be modified in various forms and may be implemented in various modes. Each of the embodiments disclosed below may be implemented alone or in combination with at least one of any or all of the other embodiments.

In the drawings, some components which are not directly related to a characteristic of the disclosure may be omitted to clearly represent the disclosure. In addition, some components in the drawings may be shown to be exaggerated in size or proportion for clarity and for ease of description thereof. Throughout the drawings, the same or similar components will be given by the same reference numerals and symbols as much as possible even though they may be shown in different drawings, and repetitive descriptions will be omitted insofar as the descriptions have already been provided. The specification should be construed as including all the changes, equivalents and substitutions included in the spirit and scope of the disclosure.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When a layer, film, region, substrate, or area, is referred to as being "on" another layer, film, region, substrate, or area, it may be directly on the other film, region, substrate, or area, or intervening films, regions, substrates, or areas, may be present therebetween. Conversely, when a layer, film, region, substrate, or area, is referred to as being "directly on" another layer, film, region, substrate, or area, intervening layers, films, regions, substrates, or areas, may be absent therebetween. Further when a layer, film, region, substrate, or area, is referred to as being "below" another layer, film, region, substrate, or area, it may be directly below the other layer, film, region, substrate, or area, or intervening layers, films, regions, substrates, or areas, may be present therebetween. Conversely, when a layer, film, region, substrate, or area, is referred to as being "directly below" another layer, film, region, substrate, or area, intervening layers, films, regions, substrates, or areas, may be absent therebetween. Further, "over" or "on" may include positioning on or below an object and does not necessarily imply a direction based upon gravity.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

Throughout the specification, when an element is referred to as being "connected" to another element, the element may be "directly connected" to another element, or "electrically connected" to another element with one or more intervening elements interposed therebetween. It will be further understood that when the terms "comprises," "comprising," "includes" and/or "including" are used in this specification, they or it may specify the presence of stated features, integers, steps, operations, elements and/or components, but do not preclude the presence or addition of other features, integers, steps, operations, elements, components, and/or any combination thereof.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 5% of the stated value.

Unless otherwise defined, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 illustrates a display area DA and a driving circuit of a display device according to an embodiment. Although FIG. 1 shows a light emitting display device having light emitting elements as an example of the display device, the display device is not limited thereto and may include any display devices within the spirit and scope of the disclosure.

Referring to FIG. 1, the display device according to an embodiment includes a display area DA in which pixels PXL are disposed, and a driving circuit for driving the pixels PXL. The driving circuit may include a scan driver SD, a light emission control driver ED, a data driver DD, and a timing controller TCON.

The display area DA includes scan lines S1 to Sn, light emission control lines E1 to En, and the pixels PXL connected to data lines D1 to Dm. In describing the embodiment, the term "connection" may comprehensively mean an electrical connection and/or a physical connection. For example, the pixels PXL may be electrically connected to the scan lines S1 to Sn, the light emission control lines E1 to En, and the data lines D1 to Dm.

The light emission control lines E1 to En may be chosen according to a structure and/or a driving method of the pixels PXL. In an embodiment, the emission control lines E1 to En may be omitted. In the case when the emission control lines E1 to En are omitted, the display device may not include the emission control driver ED.

According to an embodiment, the pixels PXL may be further connected to at least one other control lines (not shown). In this case, an operation of the pixels PXL may be controlled by a control signal supplied from the control line. The driving circuit may include a control line driver for driving the control line.

The pixels PXL may receive a scan signal, a light emission control signal, and a data signal from the scan lines S1 to Sn, the light emission control lines E1 to En, and the data lines D1 to Dm, respectively. The pixels PXL may be connected to a first power source ELVDD and a second power source ELVSS to receive operation power. The pixels PXL may be connected to another power source (for example, an initialization power source) according to the structure and/or the driving method of the pixels PXL.

The pixels PXL receive respective data signals from the data lines D1 to Dm when the respective scan signals are supplied from the scan lines S1 to Sn, and the pixels may emit light with a luminance corresponding to the data signals. Therefore, an image corresponding to the data signal of each frame may be displayed in the display area DA.

Each pixel PXL may include a light emitting element and a pixel circuit for driving the light emitting element. The pixel circuit controls a driving current flowing from the first power source ELVDD to the second power source ELVSS in correspondence with the data signal. To this end, the pixel circuit may include a driving transistor and at least one switching transistor.

The scan driver SD receives a scan driving control signal SCS from the timing controller TCON, and supplies the scan signals to the scan lines S1 to Sn in correspondence with the scan driving control signal SCS. For example, the scan driver SD may sequentially supply the scan signals to the scan lines S1 to Sn in correspondence with the scan driving control signal SCS. When respective scan signals are supplied to the scan lines S1 to Sn, the pixels PXL connected to the respective scan lines may be selected by the scan signals.

According to an embodiment, the scan signal may be used to select the pixels PXL in a horizontal line unit. For example, the scan signal may have a gate-on voltage (for example, a low voltage) at which a transistor (for example, the at least one switching transistor) of each pixel PXL connected to the data lines D1 to Dm may be turned on, and may be supplied to the pixels PXL of a horizontal line corresponding to each horizontal period. The pixels PXL receiving the scan signal may be connected to the data lines D1 to Dm during the period in which the scan signal is supplied to receive the respective data signals.

The light emission control driver ED receives a light emission driving control signal ECS from the timing controller TCON, and supplies the light emission control signals to the light emission control lines E1 to En in correspondence with the light emission driving control signal ECS. For example, the light emission control driver ED may sequentially supply the light emission control signals to the light emission control lines E1 to En in correspondence with the light emission driving control signal ECS. The light emission control driver ED may be chosen according to the structure and/or the driving method of the pixels PXL, and may be omitted according to an embodiment.

The light emission control signal may be used to control a light emission period (for example, a light emission timing and/or a light emission duration) of the pixels PXL. For example, the light emission control signal may have a gate-off voltage (for example, a high voltage) at which the at least one switching transistor positioned on a current path of each of the pixels PXL may be turned off. In this case, the pixel PXL may be set to a non-light emission state during a period in which the light emission control signal is supplied, and may be set to a light emission state during the other periods. When a data signal corresponding to a black grayscale is supplied to at least one pixel PXL, the pixel PXL may maintain the non-light emission state during a corresponding frame period in correspondence with the data signal even though the light emission control signal of the gate-off voltage is not supplied.

The data driver DD receives a data driving control signal DCS and image data RGB from the timing controller TCON, and supplies the data signals to the data lines D1 to Dm in correspondence with the data driving control signal DCS and the image data RGB. The data signals supplied to the data lines D1 to Dm may be supplied to the pixels PXL selected by the respective scan signals.

The timing controller TCON receives various timing control signals (for example, a vertical/horizontal synchronization signal, a main clock signal, and the like) from the outside (for example, a host processor or the like within the spirit and scope of the disclosure), and generates the scan driving control signal SCS, the light emission driving control signal ECS, and the data driving control signal DCS. The scan driving control signal SCS, the light emission driving control signal ECS, and the data driving control signal DCS may be supplied to the scan driver SD, the light emission control driver ED, and the data driver DD, respectively.

The scan driving control signal SCS includes a first start pulse (for example, a scan start pulse) and a first clock signal (for example, at least one scan clock signal). The first start pulse may control an output timing of a first scan signal (for example, a scan signal supplied to a first scan line S1), and the first clock signal may be used to sequentially shift the first start pulse.

The light emission driving control signal ECS includes a second start pulse (for example, a light emission start pulse) and a second clock signal (for example, at least one light emission clock signal). The second start pulse may control an output timing of a first light emission control signal (for example, a light emission control signal supplied to a first emission control line E1), and the second clock signal may be used to sequentially shift the second start pulse.

The data driving control signal DCS includes a source sampling pulse, a source sampling clock, and a source output enable signal. The data driving control signal DCS may control a sampling operation of data.

The timing controller TCON receives input image data from the outside and rearranges the input image data to generate the image data RGB. For example, the timing controller TCON may rearrange the input image data from the outside according to a specification of the data driver DD and supply rearranged image data RGB to the data driver DD. The image data RGB supplied to the data driver DD may be used to generate the data signal.

Figure 2:
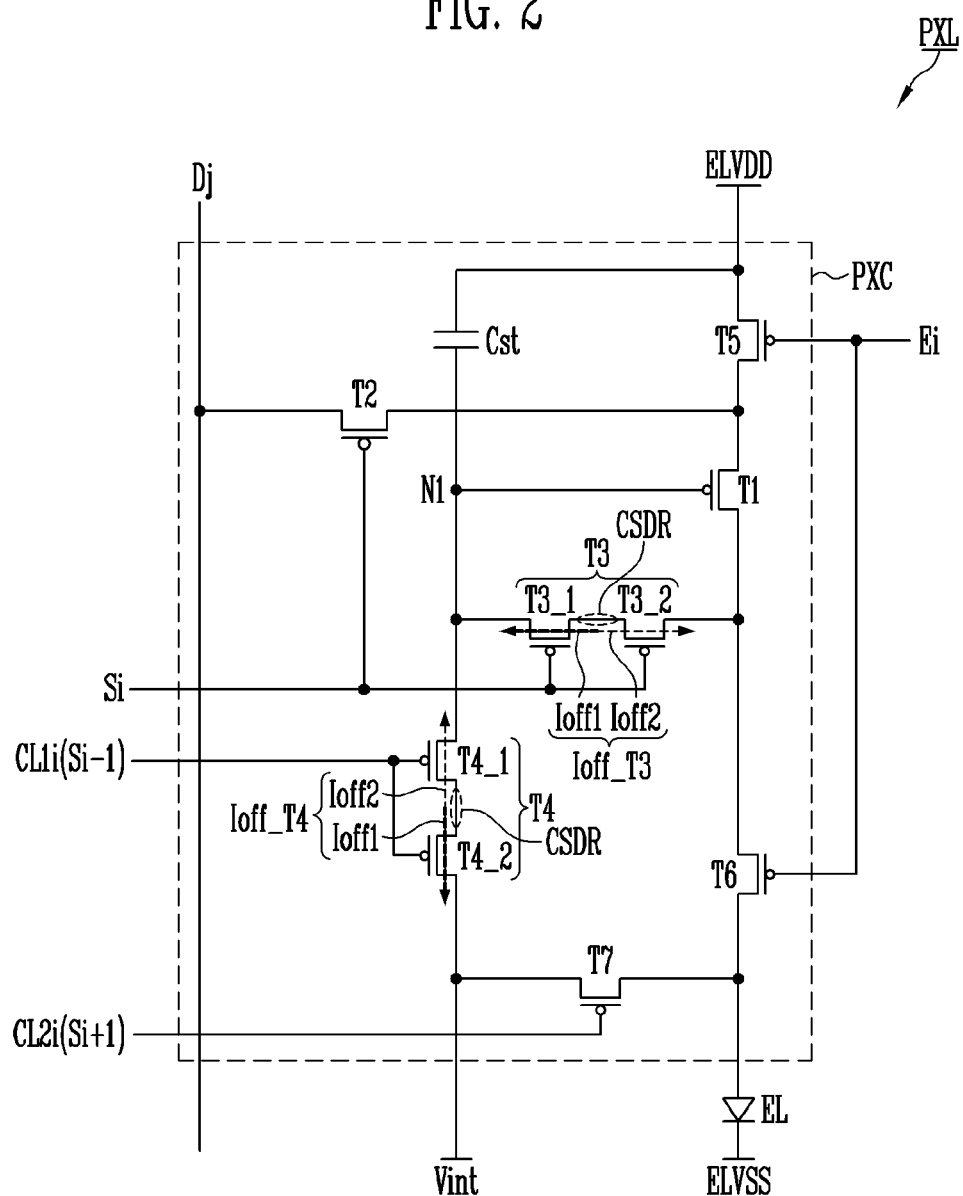
FIG. 2 illustrates a pixel PXL according to an embodiment.

FIG. 2 illustrates a pixel PXL according to an embodiment. For example, FIG. 2 shows an embodiment of a pixel PXL that may be disposed in the display area DA of FIG. 1. The pixels PXL disposed in the display area DA may each have substantially the same structure.

For convenience of the description, in FIG. 2, a pixel PXL disposed at an i-th (where i represents a natural number) pixel row (for example, an i-th horizontal line) and a j-th (where j represents a natural number) pixel column (for example, a j-th vertical line) of the display area DA is shown. In an embodiment, the pixel PXL may be connected to an i-th scan line Si, an i-th light emission control line Ei, and a j-th data line Dj. For example, the pixel PXL may be connected to at least one other control line. For example, the pixel PXL may be connected to an i-th first control line CL1$i$ and an i-th second control line CL2$i$. For convenience of the description, in describing the embodiment of FIG. 2, the "i-th scan line Si", the "i-th light emission control line Ei", and the "j-th data line Dj" may be referred to as a "scan line Si", a "light emission control line Ei", and a "data line Dj", respectively, and the i-th first control line CL1$i$ and the i-th second control line CL2$i$ may be referred to as a "first control line CL1$i$" and a "second control line CL2$i$", respectively.

Referring to FIG. 2, the pixel PXL according to an embodiment may include a light emitting element EL and a pixel circuit PXC for driving the light emitting element EL. In an embodiment, the light emitting element EL may be connected between the pixel circuit PXC and the second power source ELVSS, but a position of the light emitting element EL is not limited thereto. For example, in an embodiment, the light emitting element EL may be connected between the first power source ELVDD and the pixel circuit PXC.

The light emitting element EL may be connected between the first power source ELVDD and the second power source ELVSS. For example, an anode electrode of the light emitting element EL may be connected to the first power source ELVDD through the pixel circuit PXC, and a cathode electrode of the light emitting element EL may be connected to the second power source ELVSS. The light emitting element EL may generate light of a luminance corresponding to a driving current when the driving current is supplied from a first transistor T1.

In an embodiment, the light emitting element EL may be an organic light emitting diode (OLED) including an organic light emitting layer, but is not limited thereto. For example, in an embodiment, ultra-small inorganic light emitting elements that may be as small as nano-scale to micro-scale may configure a light source of each pixel PXL.

The first power source ELVDD and the second power source ELVSS may have a potential difference that allows the light emitting element EL to emit light. For example, the first power source ELVDD may be a high potential pixel power source, and the second power source ELVSS may be a low potential pixel power source having a potential less than that of the first power source ELVDD by a threshold voltage or more of the light emitting element EL.

The pixel circuit PXC may include a driving transistor, a switching transistor, and a storage capacitor Cst. In embodiments, the pixel circuit PXC may include one or more (or at least one) switching transistor(s). For example, the pixel circuit PXC may include the first transistor T1 that controls a driving current in correspondence with a voltage of a first node N1, as the driving transistor, at least one switching transistor(s) (for example, a second transistor T2, a third transistor T3, and/or a fourth transistor T4) directly or indirectly connected to the first node N1 to transfer the data signal or a voltage of the initialization power source Vint to the first node N1, and the storage capacitor Cst.

In an embodiment, the pixel circuit PXC may include additional switching transistor(s). For example, the pixel circuit PXC may include a fifth transistor T5 and/or a sixth transistor T6 positioned on the current path of the driving current to control the light emission period of the pixel PXL, and a seventh transistor T7 for transferring the voltage of the initialization power source Vint to one electrode of the light emitting element EL.

The structure of the pixel circuit PXC may be variously changed in different embodiments. The pixel PXL may include the pixel circuit PXC having various structures and/or operating in various driving methods.

In an embodiment, each of the first to seventh transistors T1 to T7 may be a P-type transistor. However, the disclosure is not limited thereto. For example, in another embodiment, each of the first to seventh transistors T1 to T7 may be an N-type transistor. In other embodiments, some of the first to seventh transistors T1 to T7 may be P-type transistors, and others may be N-type transistors. In this case, a gate-on voltage for turning on the N-type transistor may be a high voltage.

A voltage of the data signal may be determined according to a type of the first transistor T1. For example, when the first transistor T1 is a P-type transistor, as a grayscale to be expressed is higher, a data signal having a lower voltage may be supplied to each pixel PXL, and when the first transistor T1 is an N-type transistor, as a grayscale to be expressed is higher, a data signal having a higher voltage may be supplied to each pixel PXL.

The types of transistors configuring the pixel PXL and voltage levels of various control signals for controlling the transistors (for example, the scan signal, the data signal, the first control signal, the second control signal, and/or the light emission control signal) may be variously changed according to an embodiment.

The first transistor T1 may be connected between the first power source ELVDD and the second power source ELVSS to be positioned on the current path of the driving current. For example, the first transistor T1 may be connected between the first power source ELVDD and the light emitting element EL. For example, a first electrode (for example, a source electrode) of the first transistor T1 may be connected to the first power source ELVDD through the fifth transistor T5 and a second electrode (for example, a drain electrode) of the first transistor T1 may be connected to the light emitting element EL through the sixth transistor T6. A gate electrode of the first transistor T1 may be connected to the first node N1.

The first transistor T1 may be the driving transistor that controls the driving current flowing through the light emitting element EL in correspondence with a gate voltage, that is, a voltage of the first node N1. For example, during the light emission period of each frame, the first transistor T1 may control the driving current flowing from the first power source ELVDD to the second power source ELVSS through the light emitting element EL in correspondence with the voltage of the first node N1.

The second transistor T2 may be connected between the data line Dj and the first electrode of the first transistor T1. A gate electrode of the second transistor T2 may be connected to the scan line Si.

The second transistor T2 may be turned on when a scan signal of a gate-on voltage (for example, a low voltage) is supplied to the scan line Si to connect the data line Dj to the first electrode of the first transistor T1. Therefore, when the second transistor T2 is turned on, a data signal from the data line Dj may be transferred to the first electrode of the first transistor T1. During a period in which the second transistor T2 is turned on by the scan signal, the third transistor T3 is also turned on by the scan signal, and the first transistor T1 is turned on in a form of a diode connection by the third transistor T3. Therefore, the data signal from the data line Dj may be transferred to the first node N1 through the second transistor T2, the first transistor T1, and the third transistor T3. Therefore, the storage capacitor Cst may charge or store a voltage corresponding to the data signal and the threshold voltage of the first transistor T1.

The third transistor T3 may be connected between the second electrode of the first transistor T1 and the first node N1. A gate electrode of the third transistor T3 may be connected to the scan line Si. The third transistor T3 may be turned on when the scan signal of the gate-on voltage is supplied to the scan line Si to connect the second electrode of the first transistor T1 to the first node N1. Therefore, when the third transistor T3 is turned on, the first transistor T1 may be connected in a form of a diode.

The fourth transistor T4 may be connected between the first node N1 and the initialization power source Vint. A gate electrode of the fourth transistor T4 may be connected to the first control line CL1i. According to an embodiment, the first control line CL1i may be an initialization control line for initializing the pixels PXL of the i-th horizontal line, and may receive an initialization control signal of a gate-on voltage during a previous initialization period before the scan signal of the gate-on voltage is supplied to each scan line Si.

In an embodiment, the first control line CL1i may be any one scan line among previous scan lines for selecting the pixels PXL of previous horizontal lines, for example, an (i−1)-th scan line Si−1 for selecting the pixels PXL of an immediately previous horizontal line. In this case, an (i−1)-th scan signal supplied to the (i−1)-th scan line Si−1 may also be supplied to the first control line CL1i of the i-th horizontal line and used as the initialization control signal. In an embodiment, the first control line CL1i may be a control line formed separately from the scan lines S1 to Sn of the pixels PXL.

The fourth transistor T4 may be turned on when a scan signal of a gate-on voltage is supplied to the first control line CL1i. When the fourth transistor T4 is turned on, a voltage of the initialization power source Vint is transferred to the first node N1, and thus, the voltage of the first node N1 is initialized to the voltage of the initialization power source Vint.

According to an embodiment, the voltage of the initialization power source Vint may be set to a voltage equal to or less than the voltage of the data signal. For example, the voltage of the initialization power source Vint may be set to a voltage equal to or less than the lowest voltage of the data signal. When the voltage of the first node N1 is initialized to the voltage of the initialization power source Vint prior to transferring a data signal of a current frame to each pixel PXL, the first transistor T1 may be diode-connected in a forward direction during a scan period of each horizontal line (that is, a period in which the scan signal is supplied to each scan line Si) regardless of a data signal of a previous frame. Therefore, the data signal of the current frame may be stably transferred to the first node N1 regardless of the data signal of the previous frame.

The fifth transistor T5 may be connected between the first power source ELVDD and the first transistor T1. A gate electrode of the fifth transistor T5 may be connected to the light emission control line Ei. The fifth transistor T5 may be turned off when the light emission control signal of a gate-off voltage (for example, a high voltage) is supplied to the light emission control line Ei, and may be turned on in other cases.

The sixth transistor T6 may be connected between the first transistor T1 and the light emitting element EL. A gate electrode of the sixth transistor T6 may be connected to the light emission control line Ei. The sixth transistor T6 may be turned off when the light emission control signal of the gate-off voltage is supplied to the light emission control line Ei, and may be turned on in other cases.

For example, the fifth and sixth transistors T5 and T6 may be simultaneously turned on or turned off by the light emission control signal to control the light emission period of the pixels PXL. When the fifth and sixth transistors T5 and T6 are turned on, a current path through which the driving current may flow may be formed in the pixel PXL. Therefore, the pixel PXL may emit light with a luminance corresponding to the voltage of the first node N1. On the contrary, when the fifth and sixth transistors T5 and T6 are turned off, the current path may be blocked and the pixel PXL may not emit light.

According to an embodiment, the light emission control signal may be supplied as the gate-off voltage to turn off the fifth and sixth transistors T5 and T6 during an initialization period and a data programming period (for example, a scan period) of the pixel PXL. For example, the light emission control signal of the gate-off voltage may be supplied to overlap the scan signal, the first control signal, and the second control signal during a period in which each of the scan signal, the first control signal, and the second control signal has the gate-on voltage. After the voltages of the scan signal, the first control signal, and the second control signal are changed to the gate-off voltage, the light emission period of each frame may be started while the voltage of the light emission control signal is changed to the gate-on voltage. When the light emission period of the pixel PXL is controlled by using the light emission control signal, the pixel PXL may be emitted with a luminance corresponding to the data signal after the data signal is stably stored in the pixel PXL.

The seventh transistor T7 may be connected between the initialization power source Vint and one electrode (for example, an anode electrode) of the light emitting element EL. A gate electrode of the seventh transistor T7 may be connected to the second control line CL2i. According to an embodiment, the second control line CL2i may be a bypass control line for initializing a voltage charged in an organic capacitor (a parasitic capacitor generated due to a structure of the light emitting element EL) formed in the light emitting element EL of the pixels PXL positioned at the i-th horizontal line, and may receive a bypass control signal of a gate-on voltage prior to each light emission period.

In an embodiment, the second control line CL2i may be any one scan line among next scan lines for selecting the pixels PXL of the next horizontal lines, for example, an (i+1)-th scan line Si+1 for selecting the pixels PXL of an (i+1)-th horizontal line, but is not limited thereto. For example, in another embodiment, the second control line CL2i may be a current scan line (that is, the scan line Si) of each pixel PXL, or may be a control line formed separately from the scan lines S1-Sn of the pixels PXL.

The seventh transistor T7 may be turned on when a second control signal of a gate-on voltage is supplied to the second control line CL2i prior to the light emission period of each frame. When the seventh transistor T7 is turned on, the voltage of the initialization power Vint may be transferred to one electrode of the light emitting element EL. Therefore, while charges charged in the parasitic capacitor formed in the light emitting element EL are uniformly initialized, the pixel PXL may exhibit a more uniform luminance characteristic in correspondence with each data signal during the light emission period of each frame.

The storage capacitor Cst may be connected between the first power source ELVDD and the first node N1. The storage capacitor Cst may charge or store the voltage corresponding to the data signal and the threshold voltage of the first transistor T1.

In the pixel PXL according to an embodiment, the switching transistor may be formed of a dual or multi-structure transistor (hereinafter referred to as a "multi-structure transistor"). For example, in case that the pixel PXL includes one or more switching transistor(s), at least one switching transistor directly connected to the first node N1 (for example, the third or fourth transistor T3 or T4, or both of them) may be at least one multi-structure transistor including at least two sub transistors. The remaining switching transistors (i.e., switching transistors other than the at least one multi-structure transistor), for example, the second transistor T2 and the fifth to seventh transistors T5 to T7, may be configured of a transistor of a single structure (hereinafter, referred to as a "single-structure transistor").

For example, the third transistor T3 may include or be configured of sub transistors connected in series with each other to reduce a leakage current. A common conductive region CSDR (for example, a common source/drain region between two adjacent sub transistors) may be positioned between the sub transistors.

For example, the third transistor T3 may include or be configured of a dual transistor including a (3_1)-th transistor T3_1 (a first sub transistor of the third transistor T3) and a (3_2)-th transistor T3_2 (a second sub transistor of the third transistor T3) connected in series between the first node N1 and the second electrode of the first transistor T1. The common conductive region CSDR may be positioned between the (3_1)-th transistor T3_1 and the (3_2)-th transistor T3_2. For example, the (3_1)-th transistor T3_1 and the (3_2)-th transistor T3_2 may be integrally or non-integrally connected through the common conductive region CSDR.

Gate electrodes of the (3_1)-th transistor T3_1 and the (3_2)-th transistor T3_2 may be commonly connected to the scan line Si. Therefore, the (3_1)-th transistor T3_1 and the (3_2)-th transistor T3_2 may be simultaneously turned on or off in correspondence with the scan signal.

Similarly, the fourth transistor T4 may include or be configured of sub transistors connected in series with each other to reduce a leakage current. The common conductive region CSDR may be positioned between the sub transistors.

For example, the fourth transistor T4 may include or be configured of a dual transistor including a (4_1)-th transistor T4_1 (a first sub transistor of the fourth transistor T4) and a (4_2)-th transistor T4_2 (a second sub transistor of the fourth transistor T3) connected in series between the first node N1 and the initialization power source Vint. The common conductive region CSDR may be positioned between the (4_1)-th transistor T4_1 and the (4_2)-th transistor T4_2. For example, the (4_1)-th transistor T4_1 and the (4_2)-th transistor T4_2 may be integrally or non-integrally connected through the common conductive region CSDR.

Gate electrodes of the (4_1)-th transistor T4_1 and the (4_2)-th transistor T4_2 may be commonly connected to the first control line CL1$i$. Therefore, the (4_1)-th transistor T4_1 and the (4_2)-th transistor T4_2 may be simultaneously turned on or off in correspondence with the first control signal (for example, a previous scan signal).

In the embodiment, each of the third transistor T3 and the fourth transistor T4 may be configured of a dual structure transistor, but the disclosure is not limited thereto. For example, in other embodiments, the third transistor T3 and/or the fourth transistor T4 may be configured of a multi-structure transistor, and the number of transistors configuring each of the third transistor T3 and the fourth transistor T4 may be variously changed according to an embodiment. For example, the third transistor T3 or the fourth transistor T4 or both of them may include or be configured of three or more sub transistors connected in series with each other and having gate electrodes commonly connected to a same node or signal line.

In an embodiment, only one transistor (for example, the third transistor T3) of the third transistor T3 and the fourth transistor T4 may be formed of a multi-structure transistor, and the other transistor (for example, the fourth transistor T4) may be formed as a single-structure transistor. According to an embodiment, the switching transistor(s) other than the third transistor T3 and the fourth transistor T4, for example, at least one transistor (for example, the second transistor T2) among the second transistor T2 and the fifth to seventh transistors T5 to T7 may also be formed of a multi-structure transistor including sub transistors connected in series with each other.

The pixel PXL according to an embodiment may include at least one switching transistor including or configured of sub transistors. According to an embodiment, when at least one of the third transistor T3 and the fourth transistor T4 connected to the first node N1 is configured of a dual or multi-structure transistor, leakage currents of each multi-structure transistor (that is, the three transistors T3 and/or the fourth transistor T4) may be reduced or prevented. Therefore, the leakage currents through the third transistor T3 and the fourth transistor T4 may be reduced or prevented during a period in which each of the third transistor T3 and the fourth transistor T4 is turned off by the scan signal and the first control signal. In this case, the voltage of the first node N1 may be stably maintained. Therefore, the grayscale expression of the pixel PXL may be improved, and image quality of the display device may be improved.

However, even though at least one of the third transistor T3 and the fourth transistor T4 may be formed of a dual or multi-structure transistor, it may be difficult to completely block the leakage current flowing through the third transistor T3 and/or the fourth transistor T4. For example, when a voltage of the scan line Si connected to the gate electrode of the third transistor T3 is changed, a transient current Ioff_T3 may flow through the third transistor T3 in both directions. Similarly, when a voltage of the first control line CL1$i$ connected to the gate electrode of the fourth transistor T4 is changed, a transient current Ioff_T4 may flow through the fourth transistor T4 in both directions. Detailed description thereof will be described later.

FIG. 3 a graphical view of signals to illustrate a driving method of the pixel PXL according to an embodiment. For example, FIG. 3 illustrates waveforms of driving signals supplied to respective signal lines connected to the pixel PXL to drive the pixel PXL of FIG. 2. In FIG. 3, a voltage change of the common conductive region CSDR of the third and fourth transistors T3 and T4 is also shown.

Referring to FIGS. 2 and 3, one frame 1F may include a non-light emission period NEP and a light emission period EP.

The non-light emission period NEP of each frame 1F is a period during which the light emission control signal of the gate-off voltage is supplied to the light emission control line Ei of each pixel PXL. The scan signal may be supplied to the scan line connected to the pixel PXL during the non-light emission period NEP. As an example of the driving method for the pixel PXL of the i-th horizontal line of FIG. 2, the first control signal (for example, the previous scan signal) of the gate-on voltage, the scan signal (that is, the current scan signal), and the second control signal (for example, the next scan signal) of the gate-on voltage may be sequentially supplied to the first control line CL1$i$ (for example, the (i−1)-th scan line Si−1), the i-th scan line Si, and the second control line CL2$i$ (for example, the (i+1)-th scan line Si+1) during the non-light emission period NEP of each frame 1F. Hereinafter, an operation process of the pixel PXL according to the embodiment of FIG. 2 will be described in case that the first control line CL1$i$ and the second control line CL2$i$ are the (i−1)-th scan line and the (i+1)-th scan line, respectively.

When the light emission control signal of the gate-off voltage is supplied to the light emission control line Ei, the fifth and sixth transistors T5 and T6 may be turned off. Therefore, the current path through of the driving current may be blocked, and thus the pixel PXL may maintain a non-light emission state.

When the scan signal of the gate-on voltage is supplied to the (i−1)-th scan line Si−1, the fourth transistor T4 may be turned on. Therefore, the first node N1 may be initialized to the voltage of the initialization power source Vint.

When the scan signal of the gate-on voltage is supplied to the i-th scan line Si, the second and third transistors T2 and T3 may be turned on. The first transistor T1 may be turned on in a form of a diode connection by the third transistor T3. Therefore, the data signal from the data line Dj may be transferred to the first node N1 through the second transistor T2, the first transistor T1, and the third transistor T3 sequentially. At this time, the voltage corresponding to the data signal and the threshold voltage of the first transistor T1 (for example, a difference voltage between the voltage of the data signal and the threshold voltage of the first transistor T1) may be transferred to the first node N1, and the voltage transferred to the first node N1 may be stored in the storage capacitor Cst.

When the scan signal of the gate-on voltage is supplied to the (i+1)-th scan line Si+1, the seventh transistor T7 may be turned on. Therefore, the voltage of the initialization power source Vint may be transferred to the anode electrode of the light emitting element EL, and thus charges charged in the parasitic capacitor of the light emitting element EL during a previous frame period may be initialized.

The non-light emission period NEP may be ended when the voltage of the light emission control line Ei is changed to the gate-on voltage, and the light emission period EP may start after the non-light emission period NEP. During the light emission period EP of each frame 1F, the voltage of the light emission control line Ei may be maintained at the gate-on voltage. Therefore, the fifth and sixth transistors T5 and T6 may be turned on, and thus the current path through which the driving current may flow may be formed in the pixel PXL.

During the light emission period EP of each frame 1F, the first transistor T1 may generate a driving current corresponding to the voltage of the first node N1. The driving current may flow from the first power source ELVDD to the second power source ELVSS through the fifth transistor T5, the first transistor T1, the sixth transistor T6, and the light emitting element EL sequentially. Therefore, the light emitting element EL may emit light with a luminance corresponding to the driving current.

However, during the non-light emission period NEP of each frame 1F, for example, during the period in which the scan signal of the gate-on voltage is supplied to the i-th scan line Si, the first transistor T1 may not generate a driving current when the data signal corresponding to the black grayscale is supplied to the data line Dj. In this case, the pixel PXL may maintain the non-light emission state and may express a black grayscale even in the light emission period EP of a corresponding frame.

In the method described above, the pixel PXL may express a luminance corresponding to the data signal of each frame 1F.

In an embodiment, at least one switching transistor connected to the first node N1, for example, the third or fourth transistors T3 and T4 or both, may be formed as a dual or multi-structure transistor. Therefore, a leakage current of the pixel PXL may be reduced to some extent.

However, even though at least one of the third transistor T3 and the fourth transistor T4 is formed of a multi-structure transistor, it may be difficult to completely block the leakage current flowing through the third transistor T3 and/or the fourth transistor T4. For example, in at least one of the third transistor T3 and the fourth transistor T4, since the common conductive region CSDR between the respective sub transistors is in a floating state, a transient current may occur when each gate voltage is changed.

For example, as the supply of the scan signal to the (i−1)-th scan line Si−1 is stopped at a time t1 and thus the voltage of the (i−1)-th scan line Si−1 increases, a voltage V[CSDR_T4] of the common conductive region CSDR of the fourth transistor T4 may increase. In this case, the transient current Ioff_T4 may flow through the fourth transistor T4 in both directions. For example, in the fourth transistor T4, a first transient current Ioff1 (also referred to as a "main transient current") of a larger current amount may flow in a direction of the initialization power source Vint, and a second transient current Ioff2 (also referred to as a "sub transient current") of a less current amount may flow in a direction of the first node N1.

Similarly, as the supply of the scan signal to the i-th scan line Si is stopped at a time t2 and thus the voltage of the i-th scan line Si increases, a voltage V[CSDR_T3] of the common conductive region CSDR of the third transistor T3 may increase. In this case, the transient current Ioff_T3 may flow through the third transistor T3 in both directions. For example, in the third transistor T3, the first transient current Ioff1 of a larger current amount may flow in the direction of the first node N1, and the second transient current Ioff2 of a less current amount may flow in a direction of the initialization power source Vint. Here, the first transient current Ioff1 and the second transient current Ioff2 may mean a main transient current and a sub transient current among the transient currents of both directions generated in a given transistor (for example, the third transistor T3 and/or the fourth transistor T4), respectively. According to an embodiment, the first and second transient currents Ioff1 and Ioff2 flowing through the third transistor T3 may be the same as or different from the first and second transient currents Ioff1 and Ioff2 flowing through the fourth transistor T4.

When transient currents Ioff_T3 and Ioff_T4 occur in at least one of the third transistor T3 and the fourth transistor T4 connected to the first node N1, the voltage of the first node N1 may be changed. Therefore, each pixel PXL may not sufficiently express the luminance corresponding to the data signal of each frame.

For example, in a low frequency mode in which the pixels PXL are driven at a low frequency lower than a reference frequency (for example, at about 60 Hz), as each frame 1F lasts longer, the voltage change (for example, a voltage increase) of the first node N1 may be intensified. In this case, a larger image quality reduction may occur in the display device than in a high frequency mode, such as the occurrence of flicker that a user may recognize.

Therefore, in embodiments, a structure capable of reducing or preventing a leakage current that may occur in at least one switching transistor provided in the pixel PXL is disclosed. For example, in embodiments to be described below, a structure of a pixel PXL capable of reducing or blocking the transient currents Ioff_T3 and Ioff_T4 that may occur in at least one of the third transistor T3 and the fourth transistor T4 connected to the first node N1 is disclosed.

FIGS. 4A to 4D illustrate pixels PXL according to embodiments, respectively. For example, FIGS. 4A to 4D illustrate different embodiments of a pixel PXL that may be disposed in the display area DA of FIG. 1. In describing the embodiments of FIGS. 4A to 4D, the same or similar components as those of the above-described embodiments (for example, the embodiments of the pixel PXL of FIG. 2) are denoted by the same reference numerals, and detailed description will be omitted with respect to the same features that were previously described above.

Figure 4A:
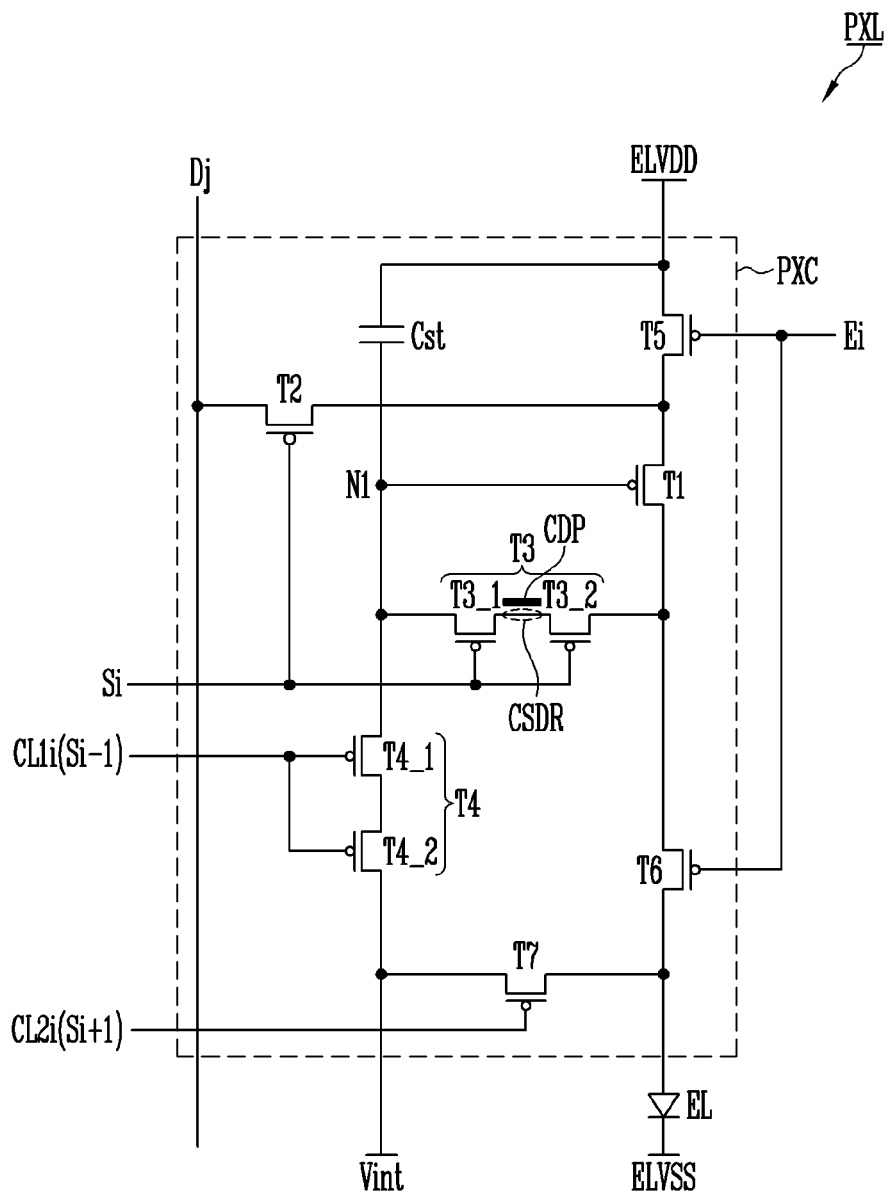
FIGS. 4A to 4D illustrate pixels PXL according to an embodiment, respectively.

Referring to FIG. 4A, the third transistor T3 may be formed of a dual or multi-structure transistor and may include the common conductive region CSDR between the (3_1)-th transistor T3_1 and the (3_2)-th transistor T3_2. The pixel PXL may include a conductive pattern CDP disposed to overlap the common conductive region CSDR of the third transistor T3. For example, the conductive pattern CDP may be disposed under an active layer of the third transistor T3 to overlap the common conductive region CSDR of the third transistor T3. According to an embodiment, the conductive pattern CDP may be regarded as a component of the third transistor T3 or may be regarded as a component of the pixel PXL separately from the third transistor T3.

Additionally, the numbering of the transistors may be arbitrary and thus the third transistor may be any assigned number. For example, the third transistor T3 may be labeled a first, second, third, fourth, fifth, sixth, seventh, or the like, transistor without departing from the spirit and scope of the disclosure. The identification of the transistors is for ease of description and is not limited thereto.

The conductive pattern CDP may have conductivity by including at least one conductive material. The conductive pattern CDP may be transparent, opaque, or translucent. For example, the conductive pattern CDP may be a light blocking pattern formed of a light blocking metal, but is not limited thereto.

In an embodiment, the conductive pattern CDP may be electrically isolated. For example, the conductive pattern CDP may be insulated and/or floated from other circuit elements in the vicinity of the conductive pattern CDP.

When the conductive pattern CDP is disposed to overlap the common conductive region CSDR of the third transistor T3 (for example, under the common conductive region CSDR), a potential of the common conductive region CSDR may be stabilized. For example, when the conductive pattern CD is formed of a metal, since the metal itself has a work function, even though the conductive pattern CDP is electrically isolated, the potential of the common conductive region CSDR may be stabilized.

According to the above-described embodiment, even though a gate voltage of the third transistor T3 may be changed, the voltage change of the common conductive region CSDR between the sub transistors configuring the third transistor T3 may be reduced or minimized. Therefore, by effectively reducing or preventing the leakage current generated in the third transistor T3 (particularly, the transient current Ioff_T3), an unintended voltage change of the first node N1 may be reduced or minimized and the operation characteristic of the pixel PXL may be stabilized.

Figure 4B:
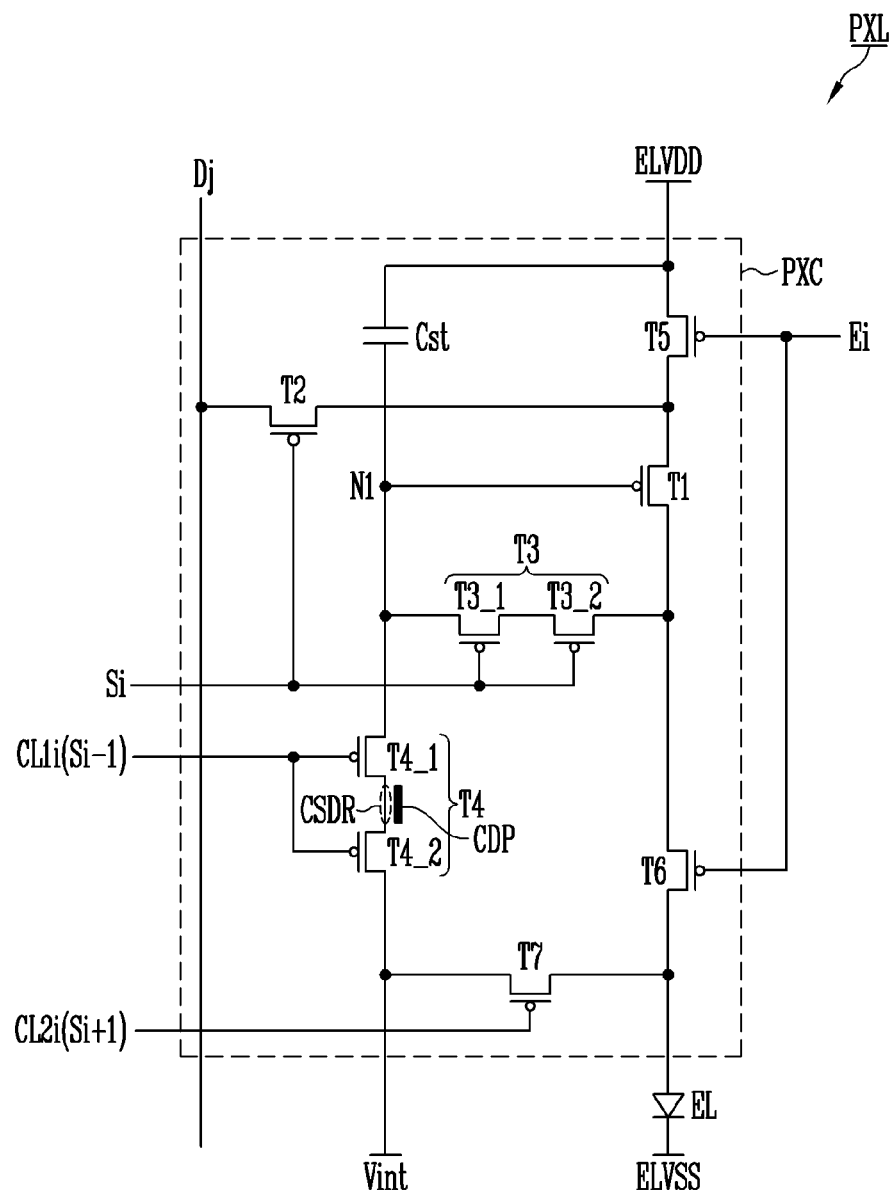

Referring to FIG. 4B, the fourth transistor T4 may be formed of a dual or multi-structure transistor and may include the common conductive region CSDR between the (4_1)-th transistor T4_1 and the (4_2)-th transistor T4_2. The pixel PXL may include a conductive pattern CDP disposed to overlap the common conductive region CSDR of the fourth transistor T4. For example, the conductive pattern CDP may be disposed under an active layer of the fourth transistor T4 to overlap the common conductive region CSDR of the fourth transistor T4. According to an embodiment, the conductive pattern CDP may be regarded as a component of the fourth transistor T4 or may be regarded as a component of the pixel PXL separately from the fourth transistor T4.

The conductive pattern CDP may have conductivity by including at least one conductive material. The conductive pattern CDP may be transparent, opaque, or translucent. For example, the conductive pattern CDP may be a light blocking pattern formed of a light blocking metal, but is not limited thereto.

In an embodiment, the conductive pattern CDP may be electrically isolated. For example, the conductive pattern CDP may be insulated and/or floated from other circuit elements in the vicinity of the conductive pattern CDP. When the conductive pattern CDP is disposed to overlap the common conductive region CSDR of the fourth transistor T4 (for example, under the common conductive region CSDR), a potential of the common conductive region CSDR may be stabilized.

According to the above-described embodiment, even though the gate voltage of the fourth transistor T4 may be changed, the voltage change of the common conductive region CSDR between the sub transistors configuring the fourth transistor T4 may be reduced or minimized. Therefore, by effectively reducing or preventing the leakage current (particularly, the transient current Ioff_T4) generated in the fourth transistor T4, an unintended voltage change of the first node N1 may be reduced or minimized and the operation characteristic of the pixel PXL may be stabilized.

Figure 4C:
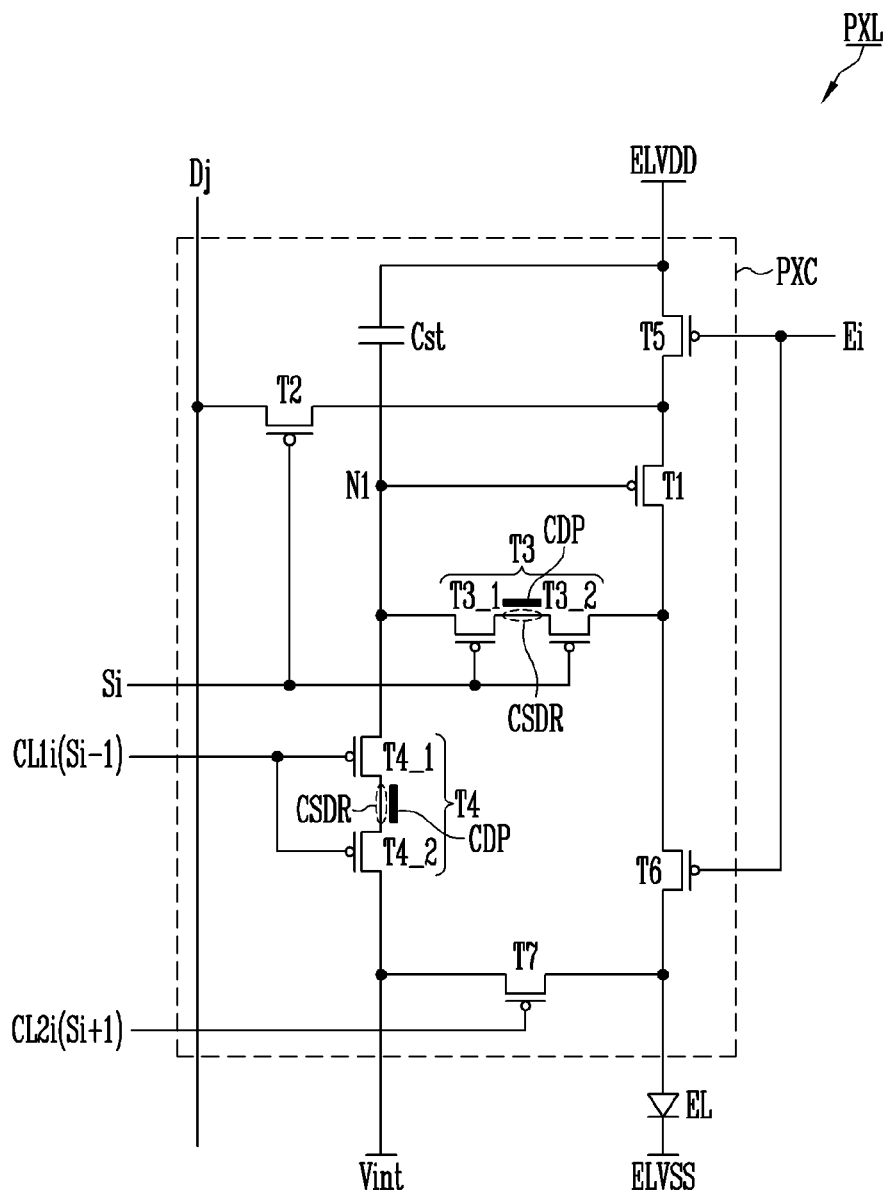

Referring to FIG. 4C, the pixel PXL may include conductive patterns CDP disposed to overlap the common conductive region CSDR of each of the third transistor T3 and the fourth transistor T4. Therefore, even though the gate voltage of each of the third transistor T3 and the fourth transistor T4 may be changed, the leakage current generated in each of the third transistor T3 and the fourth transistor T4 (particularly, the transient current Ioff_T3 and Ioff_T4) may be effectively reduced or prevented and the operation characteristic of the pixel PXL may be stabilized.

Figure 4D:
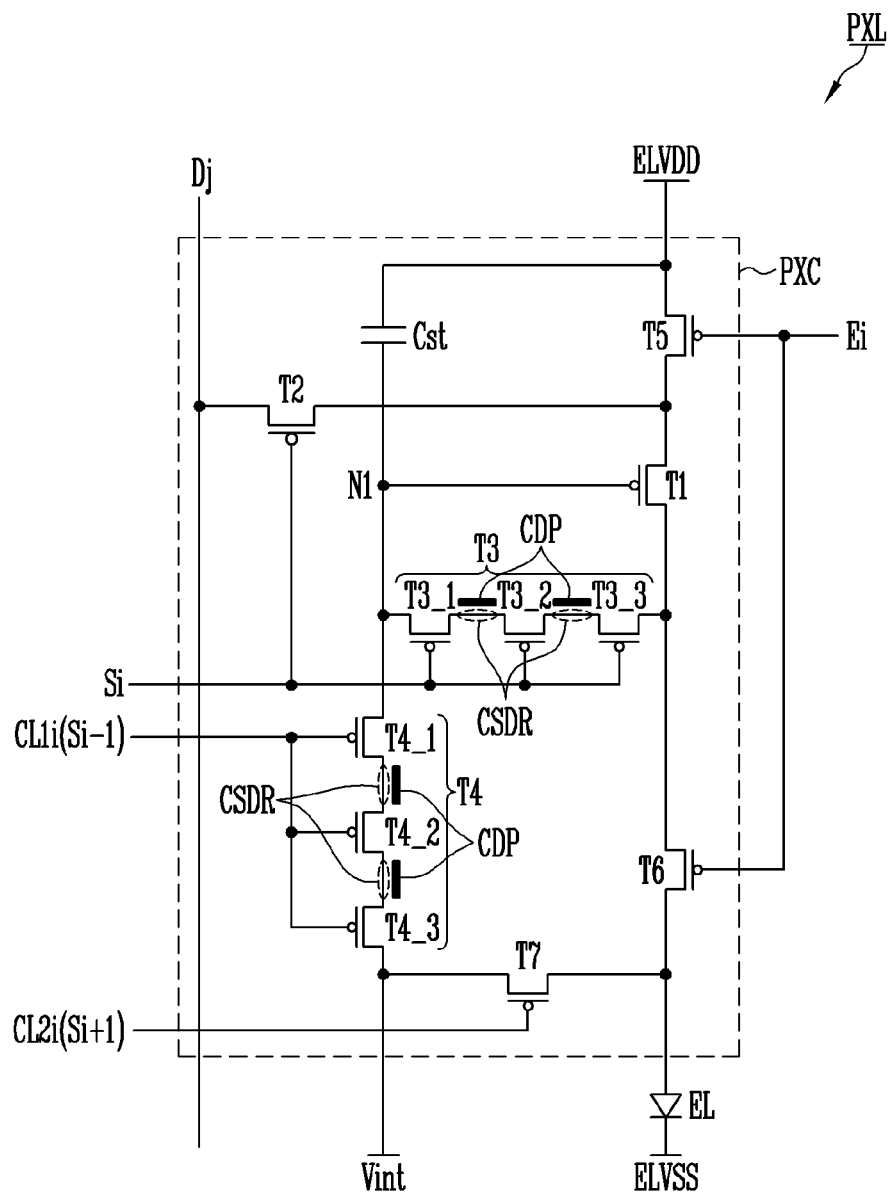
Figure 5A:
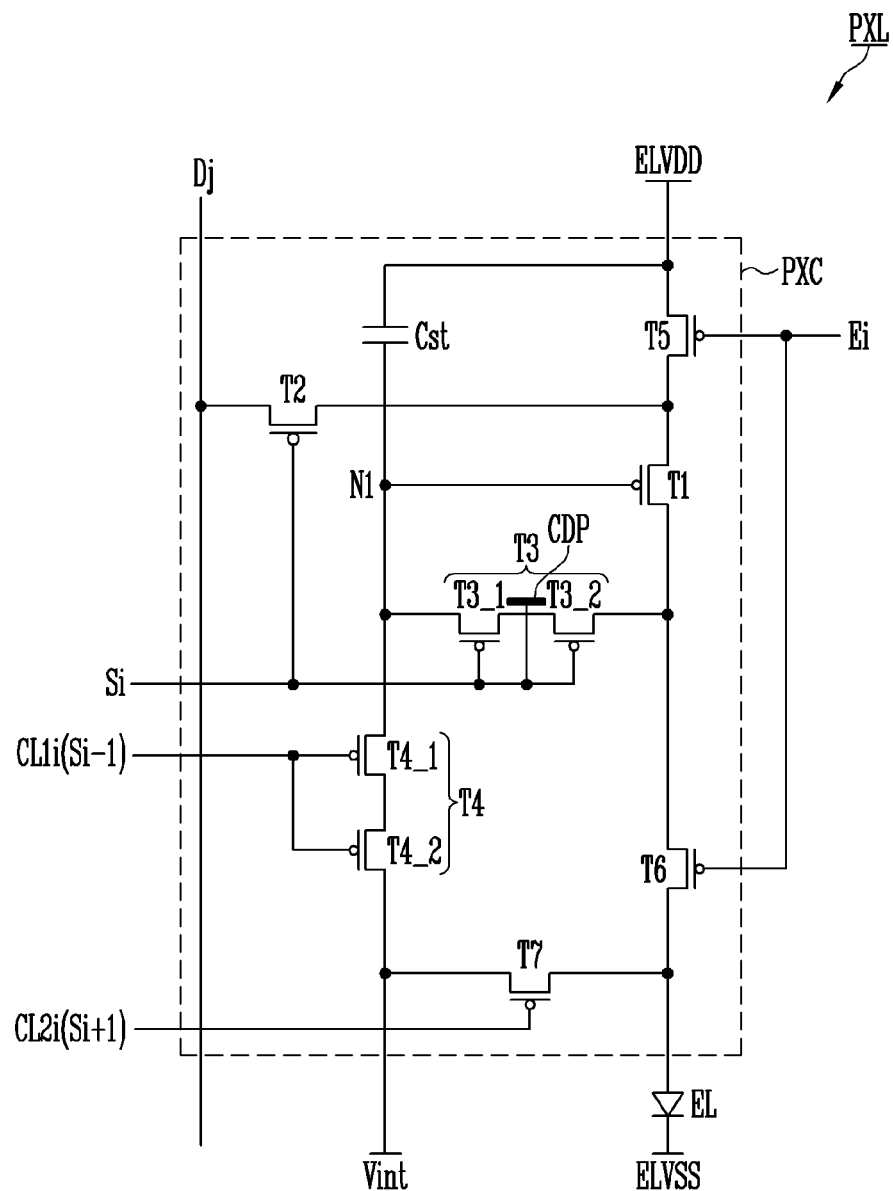
FIGS. 5A to 5D illustrate pixels PXL according to an embodiment, respectively.
Figure 5B:
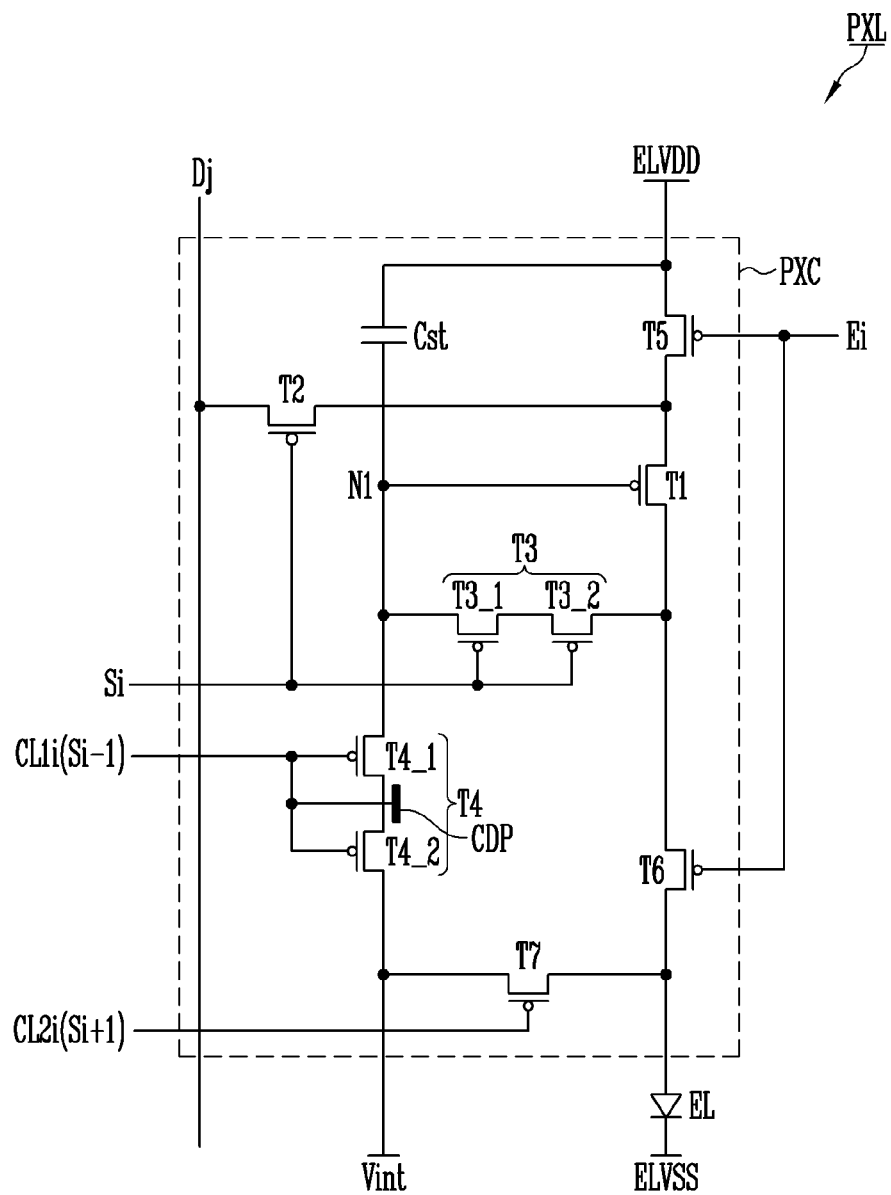
Figure 5C:
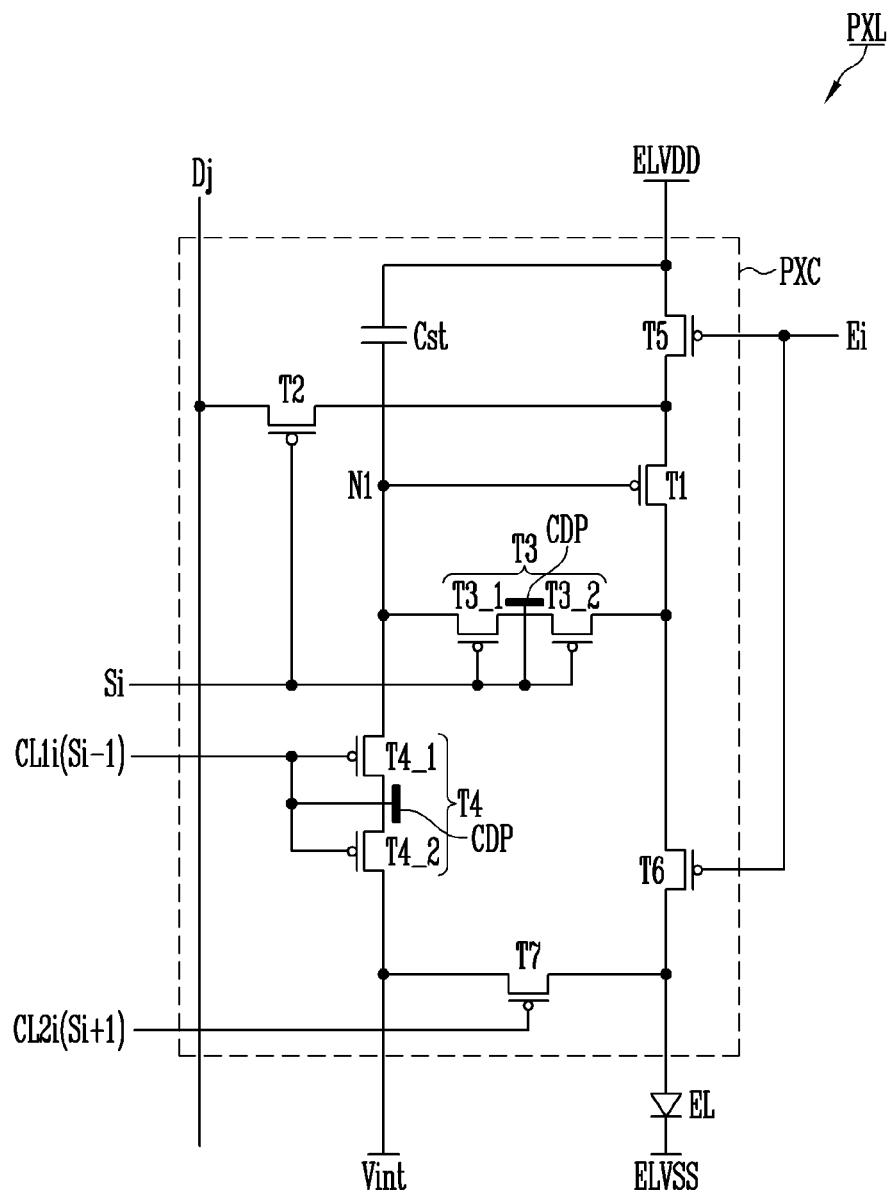
Figure 5D:
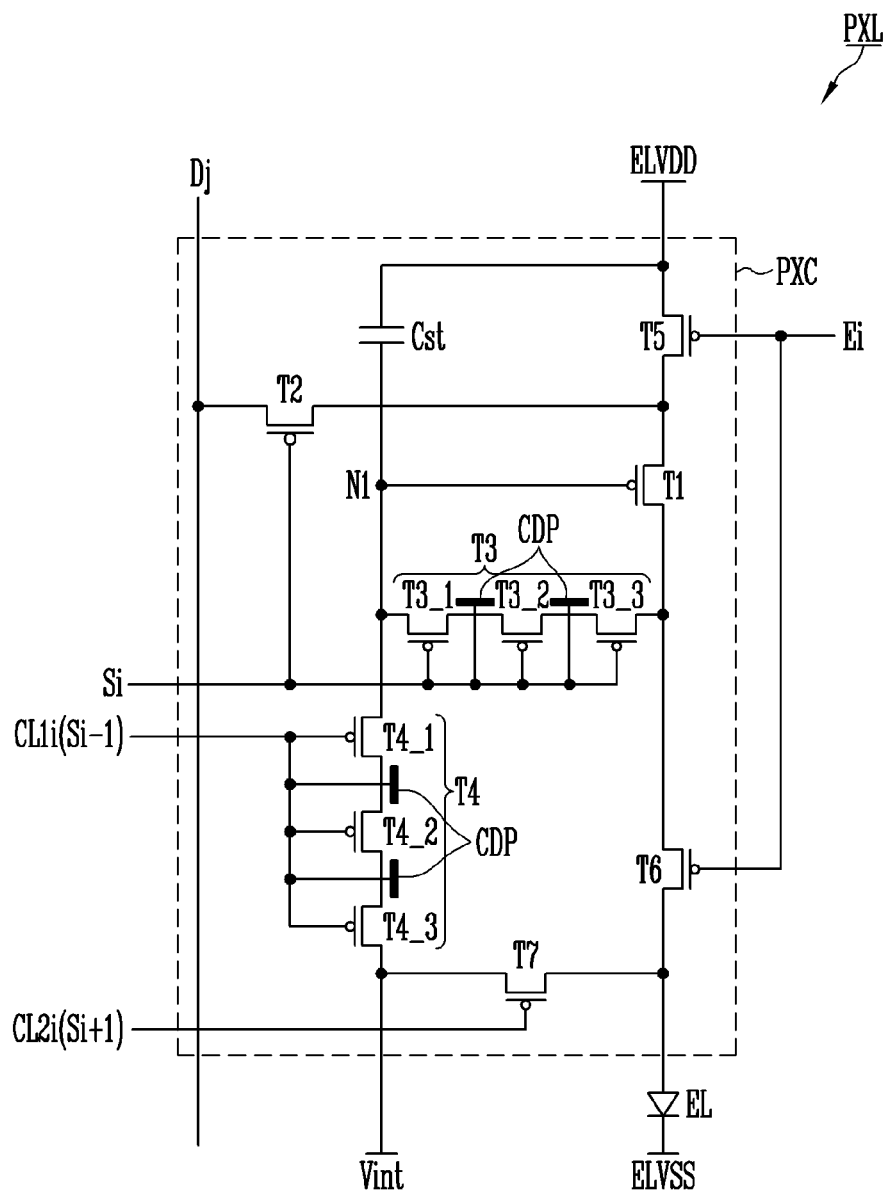
Figure 6A:
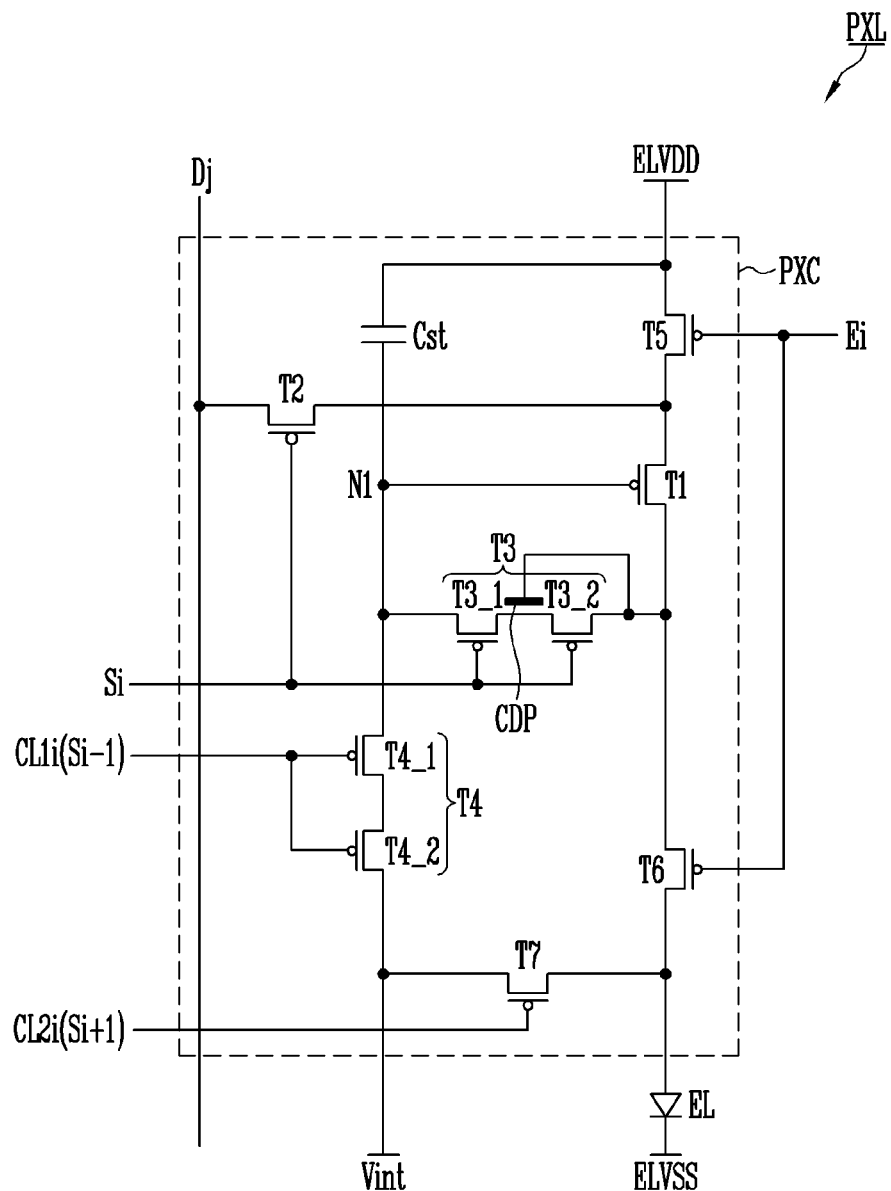
FIGS. 6A to 6D illustrate pixels PXL according to an embodiment, respectively.
Figure 6B:
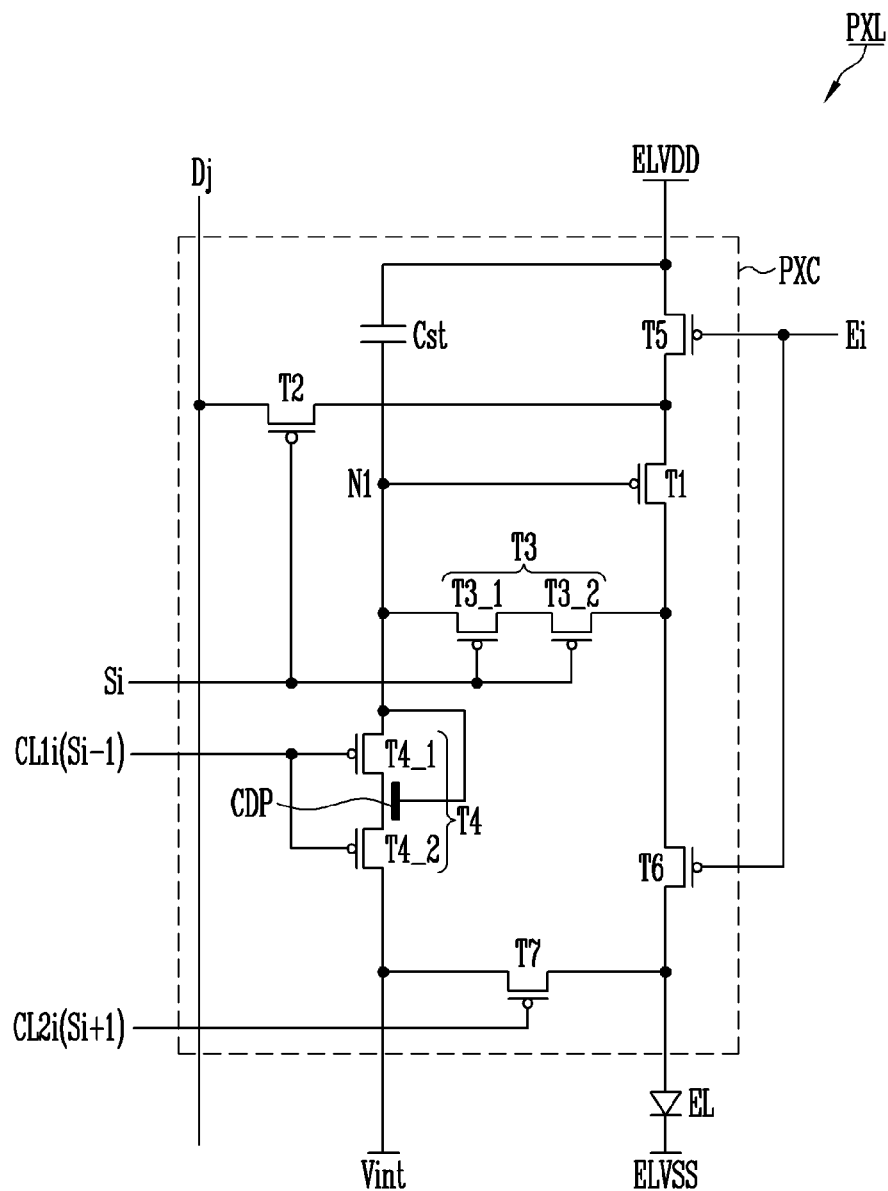
Figure 6C:
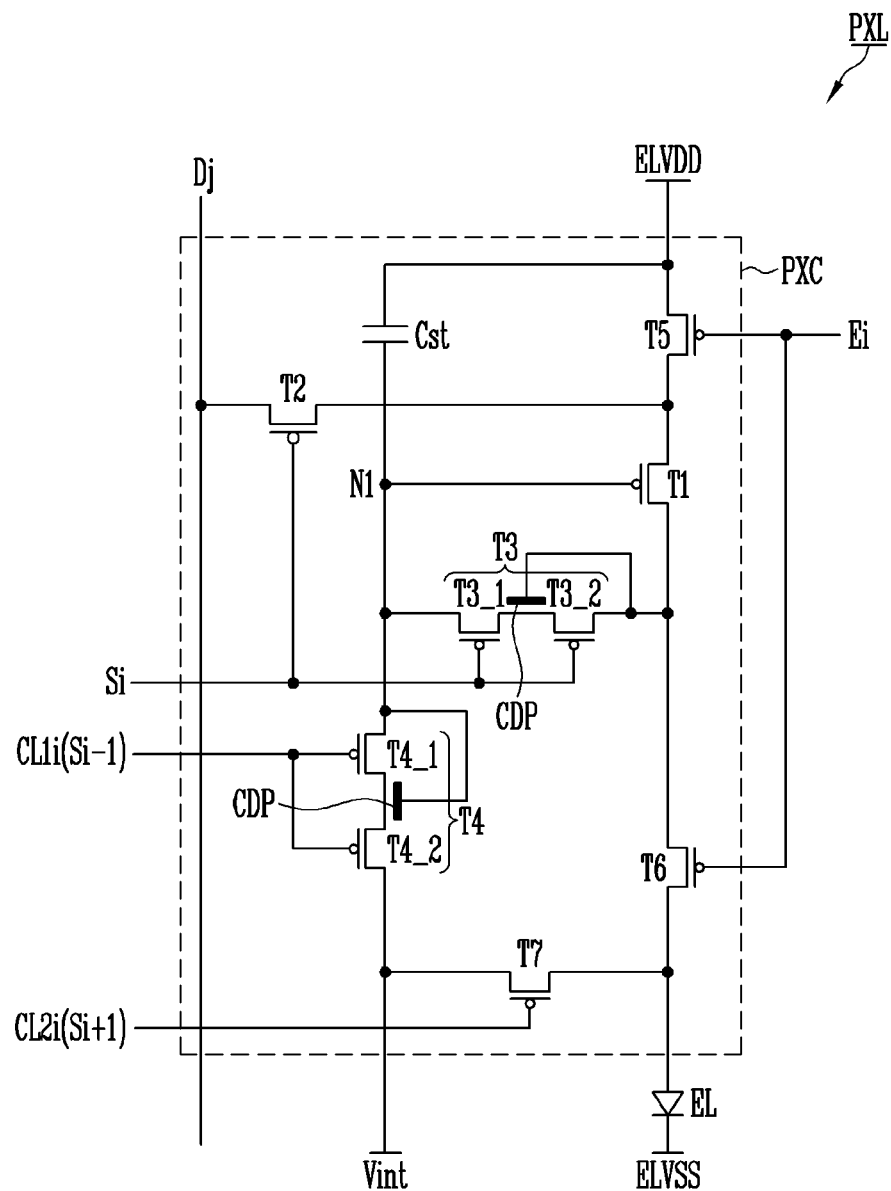
Figure 6D:
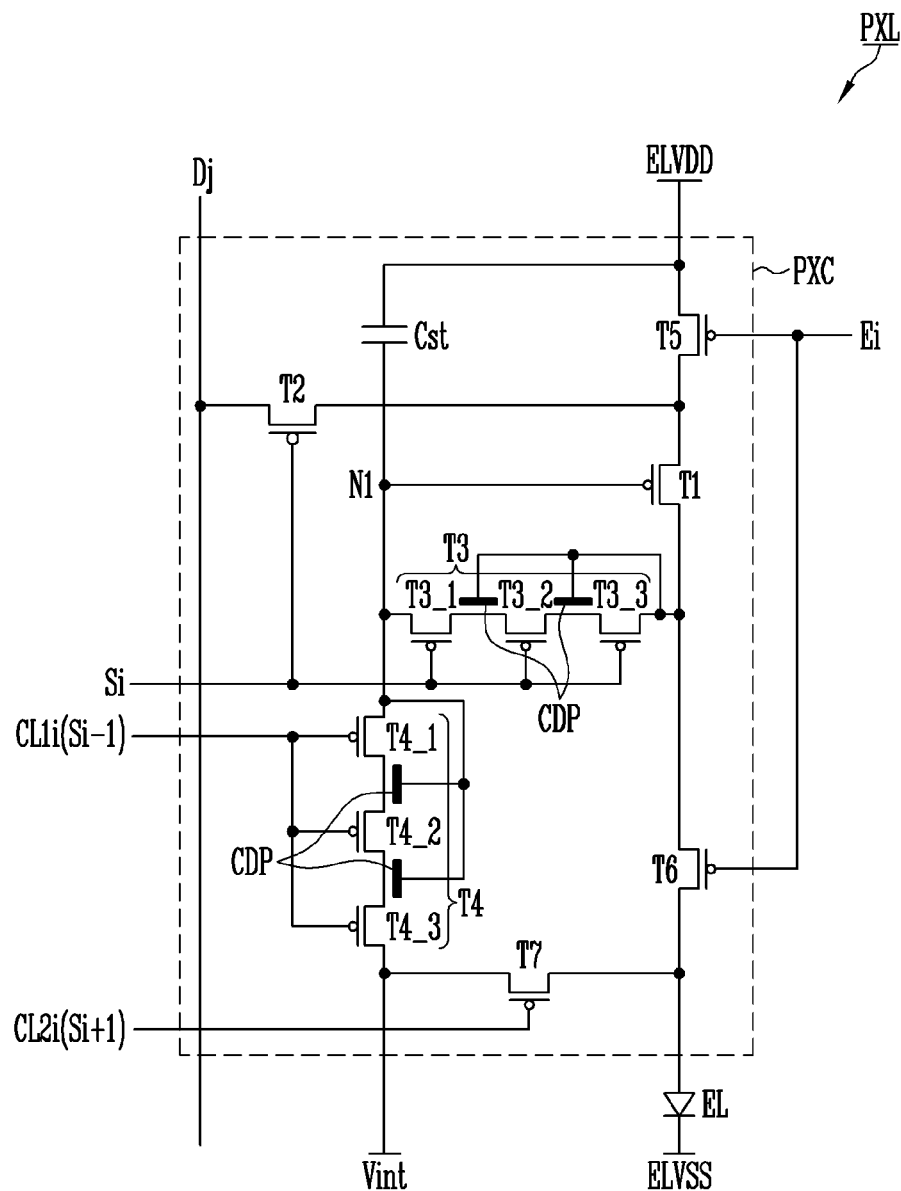
Figure 7A:
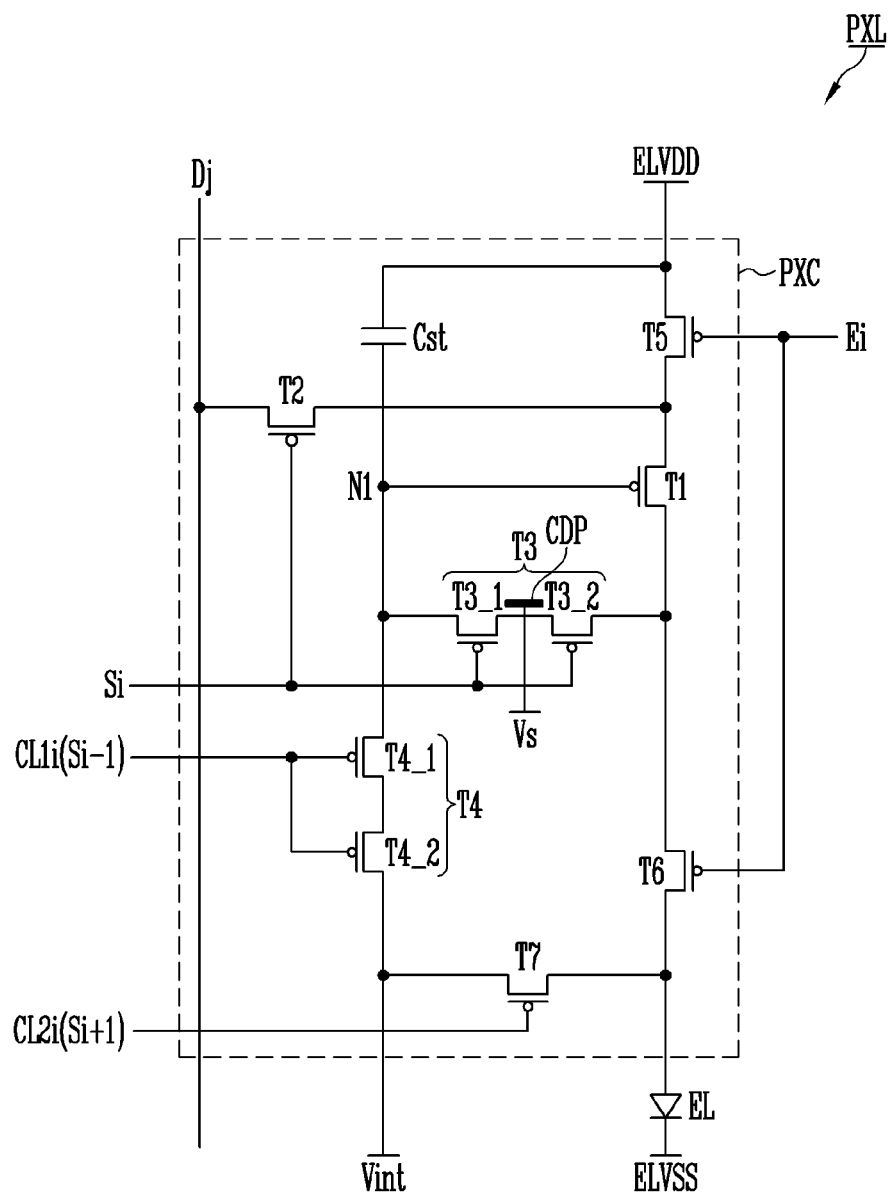
FIGS. 7A to 7D illustrate pixels PXL according to an embodiment, respectively.
Figure 7B:
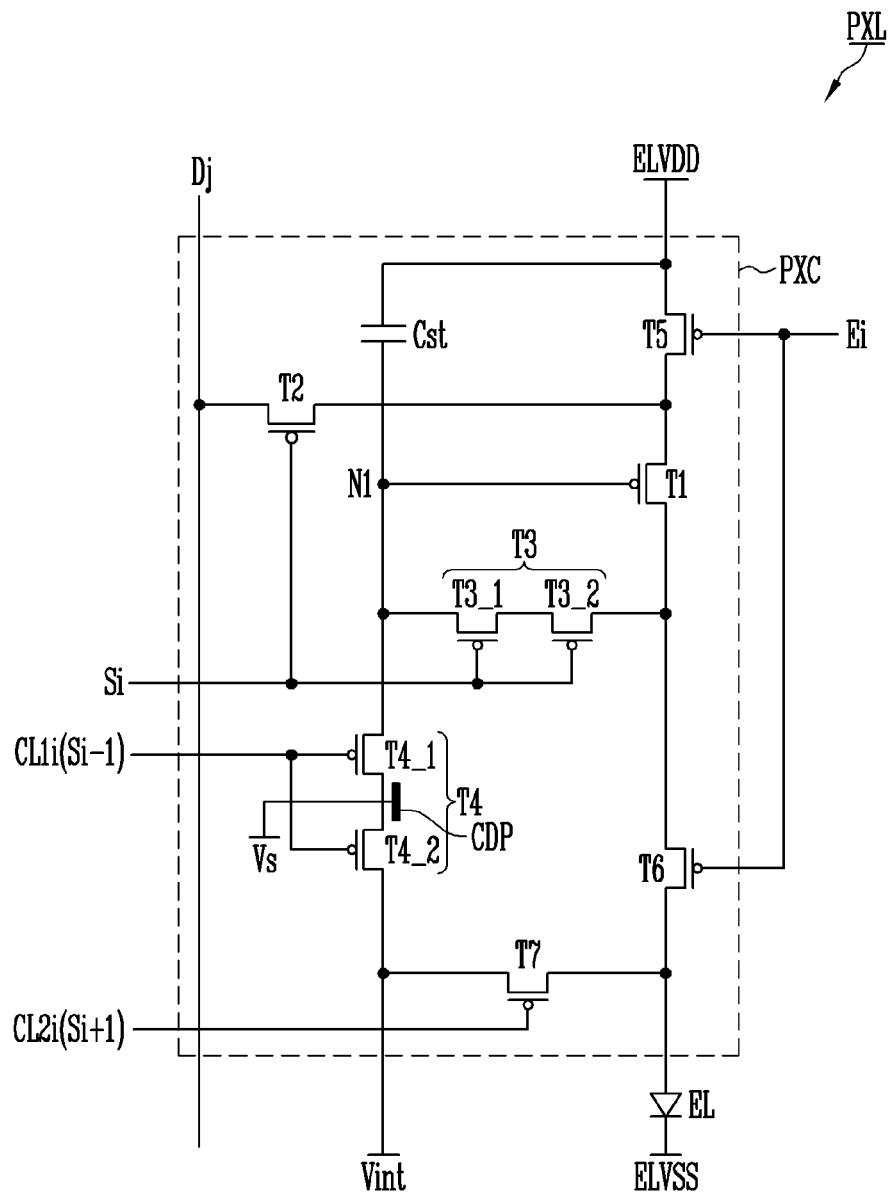
Figure 7C:
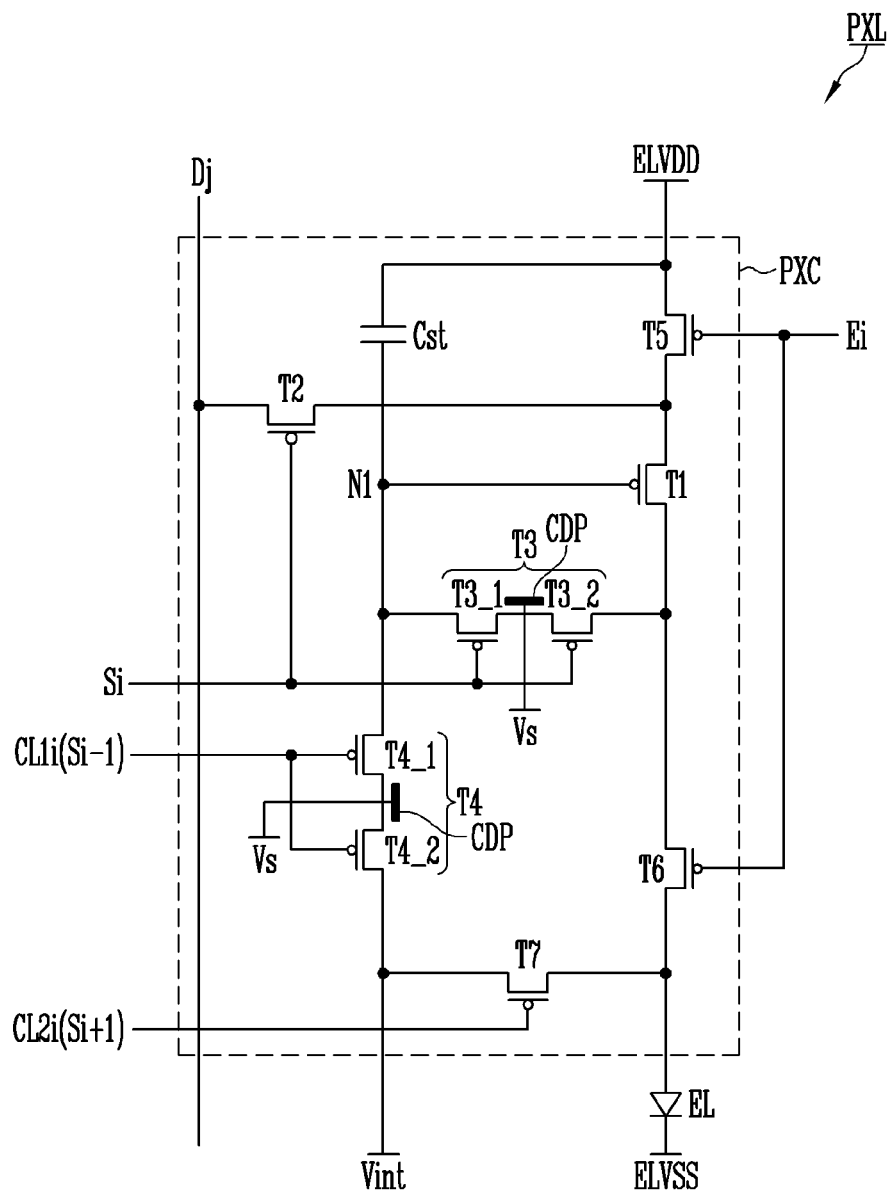
Figure 7D:
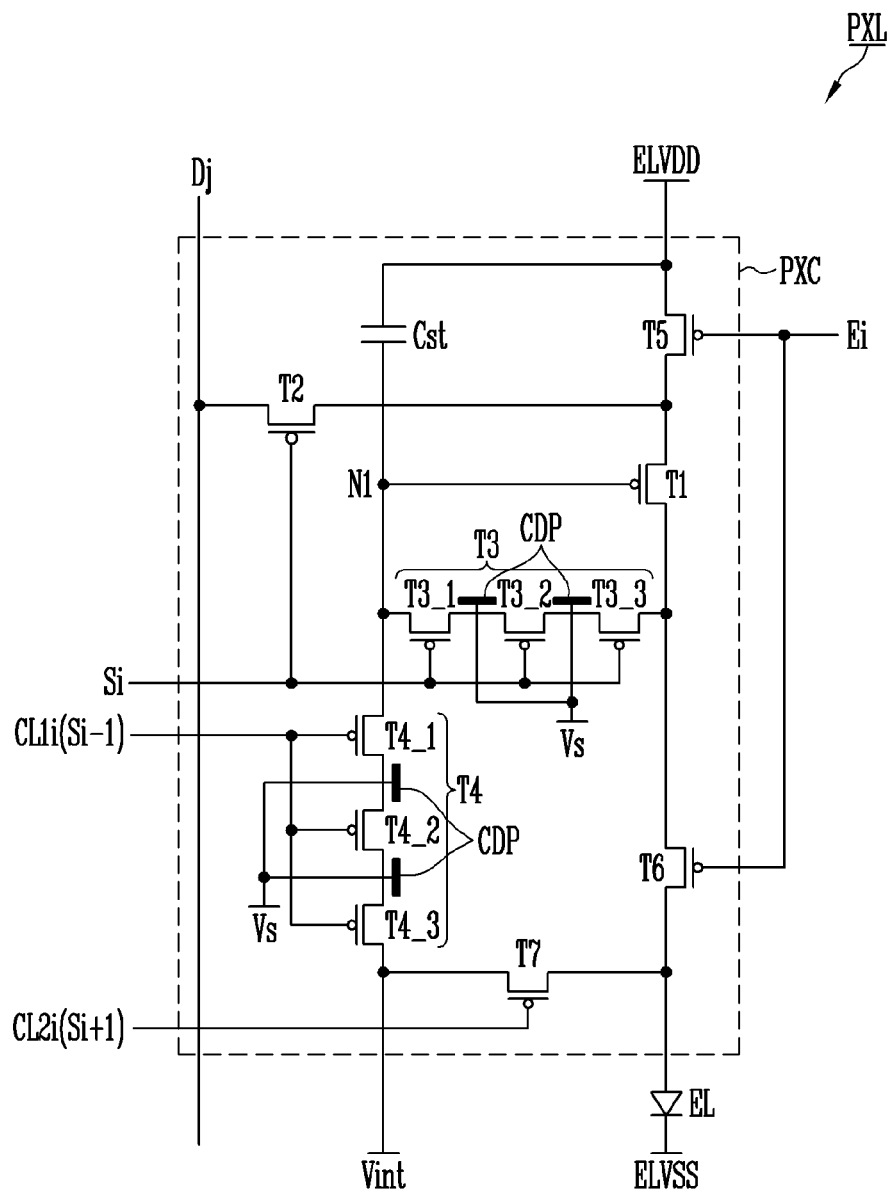

Referring to FIG. 4D, at least one switching transistor included in the pixel PXL may include a multi-structure transistor including at least three sub transistors. For example, the third transistor T3 may be configured of a multi-structure transistor (for example, triple structures) including (3_1)-th, (3_2)-th, and (3_3)-th transistors T3_1, T3_2, and T3_3 connected in series with each other, and the fourth transistor T4 may be configured of a multi-structure transistor (for example, triple structures) including (4_1)-th, (4_2)-th, and (4_3)-th transistors T4_1, T4_2, and T4_3 connected in series with each other.

In this case, each of the third transistor T3 and the fourth transistor T4 may include at least two common conductive regions CSDR positioned between two adjacent sub transistors. For example, the active layer of each of the third transistor T3 and the fourth transistor T4 may include at least two common conductive regions CSDR interposed or disposed between the active layers of at least three sub transistors.

In an embodiment, the pixel PXL may include conductive patterns CDP overlapping each of the common conductive regions CSDR. For example, the pixel PXL may include conductive patterns CDP (for example, two conductive patterns CDP) overlapping each of the common conductive regions CSDR of the third transistor T3, and conductive patterns CDP (for example, two conductive patterns CDP) overlapping each of the common conductive regions CSDR of the fourth transistor T4.

In another embodiment, only one transistor (for example, the third or fourth transistors T3 and T4) of the switching transistors of the pixel PXL may be formed of a multi-structure transistor including at least three sub transistors, and each of the remaining switching transistors may be formed of a single-structure transistor. In this case, the pixel PXL may include at least two conductive patterns CDP overlapping each of at least two common conductive regions CSDR formed in the active layer of the any one switching transistor.

The conductive patterns CDP may overlap or partially overlap the active layer of each of the third and/or fourth transistors T3 and T4 to overlap each common conductive region CSDR. For example, the conductive patterns CDP may be spaced apart from each other and separately disposed under each common conductive region CSDR.

As in the above-described embodiments, the pixel PXL according to an embodiment includes switching transistors, and at least one switching transistor of the switching transistors may be configured of a multi-structure transistor including at least one common conductive region CSDR. For example, at least one of the third transistor T3 and the fourth transistor T4 directly connected to the first node N1 may be configured as a multi-structure transistor. The pixel PXL may include at least one conductive pattern CDP overlapping or partially overlapping the active layer of at least one of the third transistor T3 and the fourth transistor T4. For example, the pixel PXL may include at least one conductive pattern CDP disposed under each conductive region CSDR.

According to the above-described embodiments, even though the gate voltage of at least one of the third transistor T3 and the fourth transistor T4 may be changed, the leakage current (particularly the transient currents Ioff_T3 and Ioff_T4) generated in at least one of the third transistor T3 and the fourth transistor T4 may be effectively reduced or prevented by reducing or minimizing the voltage change of the common conductive region CSDR between the sub transistors configuring at least one of the third transistor T3 and the fourth transistor T4. Therefore, the unintended voltage change of first node N1 may be reduced or minimized, and the operation characteristic of the pixel PXL may be stabilized. For example, even in the low frequency mode, the luminance change of the pixel PXL due to the leakage current may be reduced or minimized. Thus, the image quality of the display device may be improved, such as preventing flicker.

According to the above-described embodiments, the conductive pattern CDP may be formed to correspond to each common conductive region CSDR, and thus the leakage current of at least one of the third transistor T3 and the fourth transistor T4 may be reduced without forming a low density doped region (also referred to as a "lightly doped drain (LDD) region"). Therefore, a manufacturing process of the pixel PXL and the display device having the same may be further simplified, and the image quality of the display device may be further improved by reducing a characteristic deviation of the pixels PXL due to a process deviation.

FIGS. 5A to 5D illustrate pixels PXL according to embodiments, respectively. For example, FIGS. 5A to 5D illustrate modified embodiments of the pixel PXL according to the embodiments of FIGS. 4A to 4D. In describing the embodiments of FIGS. 5A to 5D, the same or similar components as those of the above-described embodiments are denoted by the same reference numerals, and detailed description will be omitted with respect to the same features that were previously described above.

Referring to FIGS. 4A to 4D and 5A to 5D, each conductive pattern CDP may be connected to a gate electrode of a corresponding switching transistor. In this case, the conductive pattern CDP may be one of components of the multi-structure switching transistor, and may be formed as a gate-sink structure.

For example, the conductive pattern CDP overlapping the common conductive region CSDR of the third transistor T3 may be connected to the i-th scan line Si together with gate electrodes of the (3_1)-th, (3_2)-th, and/or (3_3)-th transistors T3_1, T3_2, and T3_3 configuring the third transistor T3. Similarly, the conductive pattern CDP overlapping the common conductive region CSDR of the fourth transistor T4 may be connected to the i-th first control line CL1i together with gate electrodes of the (4_1)-th, (4_2)-th, and/or (4_3)-th transistors T4_1, T4_2, and T4_3 configuring the fourth transistor T4.

In the above-described embodiments, the potential of the common conductive region CSDR overlapping each conductive pattern CDP may be stabilized. For example, the potential of the common conductive region CSDR overlapping the conductive pattern CDP may be stabilized, by setting a voltage of the conductive pattern CDP as a voltage of a signal supplied to a signal line (for example, the i-th scan line Si and/or the i-th first control line CL1i). Therefore, the operation characteristic of the pixel PXL may be stabilized and the image quality of the display device may be improved.

FIGS. 6A to 6D illustrate pixels PXL according to embodiments, respectively. For example, FIGS. 6A to 6D illustrate modified embodiments of the pixel PXL according to the embodiments of FIGS. 4A to 4D. In describing the embodiments of FIGS. 6A to 6D, the same or similar components as those of the above-described embodiments are denoted by the same reference numerals, and detailed description will be omitted with respect to the same features that were previously described above.

Referring to FIGS. 4A to 4D and 6A to 6D, each conductive pattern CDP may be connected to a source electrode of a corresponding switching transistor. In this case, the conductive pattern CDP may be one of the components of the multi-structure switching transistor, and may be formed as a source-sink structure.

For example, the conductive pattern CDP overlapping the common conductive region CSDR of the third transistor T3 may be connected to a source electrode of the third transistor T3 (for example, a node between the first transistor T1 and the third transistor T3). Similarly, the conductive pattern CDP overlapping the common conductive region CSDR of the fourth transistor T4 may be connected to a source electrode of the fourth transistor T4 (for example, one electrode of the fourth transistor T4 connected to the first node N1).

In the above-described embodiments, the potential of the common conductive region CSDR overlapping each conductive pattern CDP may be stabilized. For example, the potential of the common conductive region CSDR overlapping the conductive pattern CDP may be stabilized, by setting the voltage of the conductive pattern CDP as a voltage of a signal supplied to a source electrode of a switching transistor corresponding to each conductive pattern CDP. Therefore, the operation characteristic of the pixel PXL may be stabilized and the image quality of the display device may be improved.

FIGS. 7A to 7D illustrate pixels PXL according to embodiments, respectively. For example, FIGS. 7A to 7D illustrate modified embodiments of the pixel PXL according to the embodiments of FIGS. 4A to 4D. In describing the embodiments of FIGS. 7A to 7D, the same or similar components as those of the above-described embodiments are denoted by the same reference numerals, and detailed description will be omitted with respect to the same features that were previously described above.

Referring to FIGS. 4A to 4D and 7A to 7D, each conductive pattern CDP may be connected to a power source Vs. In an embodiment, the power source Vs may be an operation power source supplied to the pixels PXL and/or the driving circuit. For example, the power source Vs may be a high potential pixel power source (that is, the first power source ELVDD) supplied to the pixels PXL, or a high potential operation power source (for example, a first driving power source for supplying a gate-high voltage VGH as a gate-off voltage. For example, the power source Vs may be an operation power source of various types and/or levels.

In the above-described embodiments, the potential of the common conductive region CSDR overlapping each conductive pattern CDP may be stabilized. For example, the potential of the common conductive region CSDR overlapping the conductive pattern CDP may be stabilized, by setting the voltage of the conductive pattern CDP as a voltage of a power source Vs. Therefore, the operation characteristic of the pixel PXL may be stabilized and the image quality of the display device may be improved.

Figure 8:
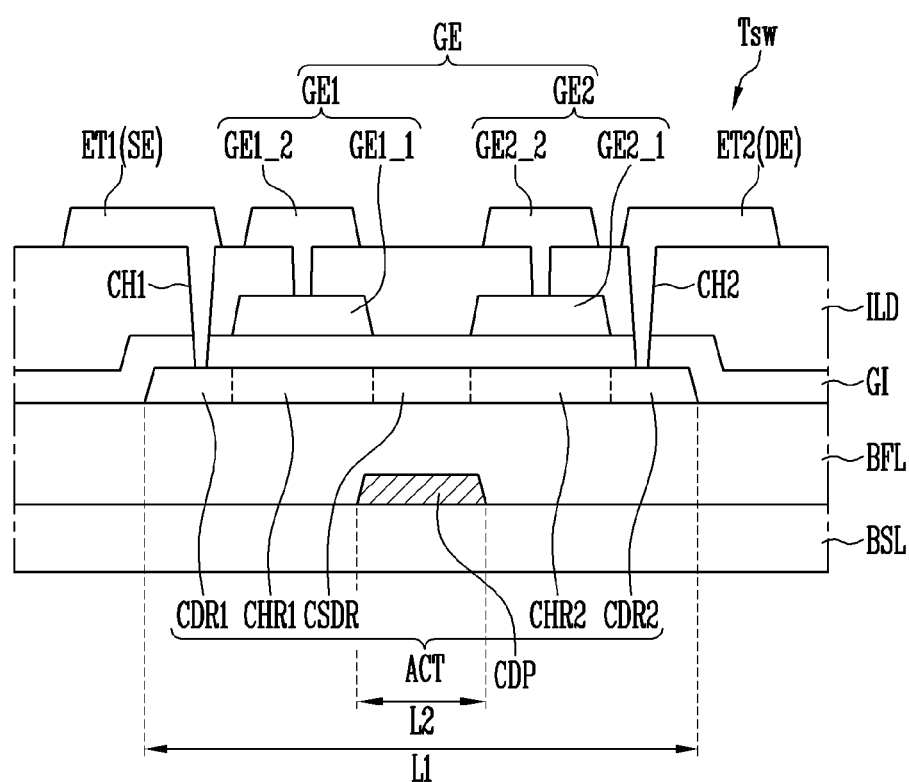
FIGS. 8 and 9 illustrate schematic cross-sectional structures of a multi-structure switching transistor according to an embodiment, respectively.
Figure 9:
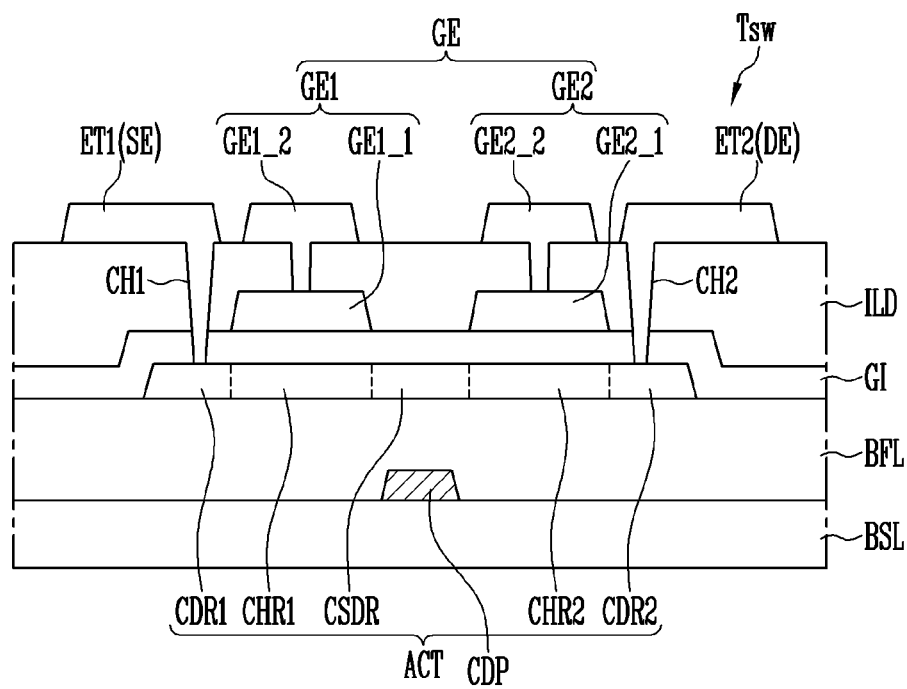

FIGS. 8 and 9 illustrate schematic cross-sectional structures of a multi-structure switching transistor Tsw according to embodiments, respectively. For convenience, in FIG. 8 and FIG. 9, a dual transistor will be disclosed as an example of the multi-structure switching transistor Tsw.

According to an embodiment, each of the switching transistors Tsw according to the embodiments of FIGS. 8 and 9 may be any one of the switching transistors that may be provided in the pixel PXL according to the embodiments of FIGS. 4A to 7D. For example, the pixel PXL may include switching transistors, and at least one of the switching transistors may be configured of a multi-structure transistor including first and second channel regions CHR1 and CHR2, and a common conductive region CSDR between the first and second channel regions CHR1 and CHR2.

Each of the switching transistors Tsw according to the embodiments of FIGS. 8 and 9 may represent multi-structure transistors that may be provided in the pixel PXL according to the embodiments of FIGS. 4A to 7D. For example, at least one of the third transistor T3 and the fourth transistor T4 according to the embodiments of FIGS. 4A to 7D may be formed of the structure of the switching transistor Tsw according to the embodiment of FIG. 8 or 9.

Referring to FIGS. 8 and 9, the switching transistor Tsw according to an embodiment may include an active layer ACT disposed on a surface of a base layer BSL on which a buffer layer BFL may be formed, a gate electrode GE overlapping a surface of the active layer ACT with a gate insulating film GI interposed or disposed between the gate electrode GE and the active layer ACT, and first and second electrodes ET1 and ET2 spaced apart from the active layer ACT and connected to different regions of the active layer ACT. A conductive pattern CDP may be disposed under one region (for example, the common conductive region CSDR) of the switching transistor Tsw. The conductive pattern CDP may be regarded as a component of the switching transistor Tsw.

According to an embodiment, the switching transistor Tsw may include channel regions for forming a channel of each sub transistor. For example, the active layer ACT of the switching transistor Tsw may include the first channel region CHR1 and the second channel region CHR2 spaced apart from each other with the common conductive region CSDR interposed or disposed between the first and second channel regions CHR1 and CHR2. According to an embodiment, the first channel region CHR1 may form a channel of a first sub transistor (for example, the (3_1)-th transistor T3_1 or the (4_1)-th transistor T4_1), and the second channel region CHR2 may form a channel of a second sub transistor (for example, the (3_2)-th transistor T3_2 or the (4_2)-th transistor T4_2).

Elements disclosed in FIGS. 8 and 9 will be described from a lower layer. The base layer BSL may be a base member for forming a display panel. According to an embodiment, the base layer BSL may be a rigid or flexible substrate or film, and a material or a physical property of the base layer BLS is not particularly limited. For example, the base layer BSL may be a rigid substrate formed of glass or tempered glass, a flexible substrate (or thin film) of a plastic or metal material, or an insulating film of at least one layer, and a material and/or a physical property thereof are/is not particularly limited. The base layer BSL may be transparent, but is not limited thereto. For example, the base layer BSL may be formed of a transparent, translucent, opaque, or reflective base member.

The conductive pattern CDP may be disposed on a surface of the base layer BSL.

The conductive pattern CDP may be disposed under the active layer ACT to overlap the active layer ACT of the switching transistor Tsw. For example, the conductive pattern CDP may be disposed under the active layer ACT to overlap the common conductive region CSDR. Therefore, the potential of the common conductive region CSDR may be stabilized.

According to an embodiment, the conductive pattern CDP may overlap the active layer ACT around the common conductive region CSDR and may overlap or partially overlap the active layer ACT. For example, the conductive pattern CDP may have a width or length that is greater than the width or length of the common conductive region CSDR in a schematic cross-sectional view as illustrated in FIG. 8. Alternatively, the conductive pattern CDP may have a width or length that is less than a width or length of the common conductive pattern CSDR in a schematic cross-sectional view as illustrated in FIG. 9. For example, the conductive pattern CDP may partially overlap the active layer ACT to have a substantially symmetrical shape with respect to the common conductive region CSDR on a line connecting first and second conductive regions CDR1 and CDR2 positioned at ends of the active layer ACT. In other words, the common conductive region CSDR may be disposed at a substantially center area of the active layer ACT such that the active layer ACT may be substantially symmetrical with respect to the common conductive region CSDR, and the conductive pattern CDP is disposed to correspond or face the common conductive region CSDR. In this case, on the line connecting the first and second conductive regions CDR1 and CDR2, when the active layer ACT has a first length L1, the conductive pattern CDP may have a second length L2 shorter than the first length L1.

The structures, shapes, and dimensions of the conductive pattern CDP and the common conductive region CSDR are not limited to that which is illustrated in the figures, and may include any structures or shapes or dimensions within the spirit and scope of the disclosure. For example, the conductive pattern CDP may have a substantially trapezoidal shape and the common conductive region CSDR may have a substantially parallelogram, rhombus, or rectangular shape in a schematic cross-sectional view. The thicknesses of the conductive pattern CDP and the common conductive region CSDR are not limited and may include any thickness within the spirit and scope of the disclosure to achieve stabilization of the common conductive region CSDR and the reduction of crosstalk and flicker.

Similarly, the materials of the conductive pattern CDP and the common conductive region CSDR are not limited and may include any materials within the spirit and scope of the disclosure to achieve stabilization of the common conductive region CSDR and the reduction of crosstalk and flicker.

In an embodiment at least as illustrated in FIGS. 8 and 9, the conductive pattern CDP and the common conductive region CSDR may be disposed or located substantially between the first and second gate electrodes GE1 and GE2 of the gate electrode GE.

In an embodiment at least as illustrated in FIGS. 8 and 9, the conductive pattern CDP and the common conductive region CSDR may be disposed or located substantially between the upper and lower electrodes GE1_2 and GE2_1 of the first and second gate electrodes GE1 and GE2.

In an embodiment, the conductive pattern CDP may be disposed not to overlap at least one region of the first and second channel regions CHR1 and CHR2. For example, the conductive pattern CDP may be disposed to not completely cover lower portions of the first and second channel regions CHR1 and CHR2.

For example, the conductive pattern CDP may overlap or partially overlap the first and/or second channel regions CHR1 and CHR2 adjacent to the common conductive region CSDR as shown in FIG. 8. The conductive pattern CDP may be formed to have a smaller area not to overlap the first and second channel regions CHR1 and CHR2 as shown in FIG. 9.

In this case, a parasitic capacitance that may be generated by the conductive pattern CDP may be reduced or minimized. Therefore, an operation characteristic (for example, an operation speed, or the like) of the switching transistor Tsw may be secured and crosstalk may be prevented.

The buffer layer BFL may be disposed on a surface of the base layer BSL including the conductive pattern CDP.

The buffer layer BFL may be formed on a surface of the base layer BSL, and may prevent an impurity from spreading to a circuit element (for example, the switching transistor Tsw) to be formed thereon by forming the buffer layer BFL. The buffer layer BFL may be configured of a single layer, but may be configured of multiple layers of at least two or more layers. When the buffer layer BFL is provided in multiple layers, each layer may be formed of the same or similar material or different materials. For example, the buffer layer BFL may be formed of multiple layers including a silicon nitride film (SiNx) and a silicon oxide film (SiOx).

The active layer ACT may be disposed on a surface of the base layer BSL including the buffer layer BFL.

The active layer ACT may include the first conductive region CDR1 and the second conductive region CDR2 spaced apart from each other, the first channel region CHR1 and the second channel region CHR2 interposed or disposed between the first conductive region CDR1 and the second conductive region CDR2, and the common conductive region CSDR interposed or disposed between the first and second channel regions CHR1 and CHR2. According to an embodiment, the active layer ACT may be a semiconductor pattern formed of polysilicon, amorphous silicon, oxide semiconductor, or the like. For example, one region of the active layer ACT may be an intrinsic semiconductor region in which an impurity may not be doped, and the other region of the active layer ACT may be a conductive region in which an impurity is doped. For example, the first and second channel regions CHR1 and CHR2 may be intrinsic semiconductor regions, and the first and second conductive regions CDR1 and CDR2 and the common conductive region CSDR may be conductive regions in which an impurity an N-type or P-type impurity may be doped.

According to an embodiment, the first channel region CHR1, and the first conductive region CDR1 and the common conductive region CSDR positioned at both sides of the first channel region CHR1 may configure an active layer of the first sub transistor. The second channel region CHR2, and the common conductive region CSDR and the second conductive region CDR2 positioned at both sides of the second channel region CHR2 may configure an active layer of the second sub transistor.

According to an embodiment, the first conductive region CDR1 and the common conductive region CSDR may be a source region and a drain region of the first sub transistor. For example, when the first conductive region CDR1 is the source region of the first sub transistor, the common conductive region CSDR may be the drain region of the first sub transistor.

Similarly, the common conductive region CSDR and the second conductive region CDR2 may be a source region and a drain region of the second sub transistor. For example, when the common conductive region CSDR is the source region of the second sub transistor, the second conductive region CDR2 may be the drain region of the second sub transistor.

The gate insulating film GI may be disposed on a surface of the base layer BSL including the active layer ACT.

The gate insulating film GI may be disposed on the active layer ACT to cover the active layer ACT. The gate insulating film GI may be interposed or disposed between the active layer ACT and the gate electrode GE. According to an embodiment, the gate insulating film GI may be formed of a single layer or multiple layers, and may include at least one inorganic insulating material and/or organic insulating material. For example, the gate insulating film GI may include various types of organic/inorganic insulating materials, including silicon nitride (SiNx) and/or silicon oxide (SiOx), and the like, and a structure and/or a configuration material of the gate insulating film GI is not particularly limited thereto.

The gate electrode GE may be disposed on a surface of the base layer BSL including the gate insulating film GI.

The gate electrode GE may be configured of sub gate electrodes overlapping respective channel regions with the gate insulating films GI interposed or disposed therebetween, and the sub gate electrodes may be integrally or non-integrally connected to each other. For example, the gate electrode GE may include a first gate electrode GE1 overlapping the first channel region CHR1 and a second gate electrode GE2 connected to the first gate electrode GE1 and overlapping the second channel region CHR2. According to an embodiment, the first gate electrode GE1 may configure a gate electrode of the first sub transistor, and the second gate electrode GE2 may configure a gate electrode of the second sub transistor.

In an embodiment, the gate electrode GE may be configured of multiple layers. For example, the first gate electrode GE1 may include a lower electrode GE1_1 disposed on the gate insulating film GI, and an upper electrode GE1_2 disposed on an interlayer insulating film ILD and connected to the lower electrode GE1_1. Similarly, the second gate electrode GE2 may include a lower electrode GE2_1 disposed on the gate insulating film GI, and an upper electrode GE2_2 disposed on the interlayer insulating film ILD and connected to the lower electrode GE2_1.

In an embodiment, the gate electrode GE may be configured of a single layer. For example, the first gate electrode GE1 and the second gate electrode GE2 may be formed of only each of the lower electrodes GE1_1 and GE2_1 disposed on the gate insulating film GI.

The interlayer insulating film ILD may be disposed on a surface of the base layer BSL including the lower electrodes GE1_1 and GE2_1 of the respective first and second gate electrodes GE1 and GE2.

The interlayer insulating film ILD may be configured of a single layer or multiple layers, and may include at least one inorganic insulating material and/or organic insulating material. For example, the interlayer insulating film ILD may include various types of organic/inorganic insulating materials, including silicon nitride (SiNx) and/or silicon oxide (SiOx), and the like, and a structure and/or a configuration material of the interlayer insulating film ILD is not particularly limited thereto.

A first electrode ET1 and a second electrode ET2 of the switching transistor Tsw may be disposed on a surface of the base layer BSL including the interlayer insulating film ILD. For example, when the first and/or second gate electrodes GE1 and GE2 are formed of multiple layers, the upper electrodes GE1_2 and GE2_2 of the first and/or second gate electrodes GE1 and GE2 may be further disposed on the interlayer insulating film ILD accordingly.

The first electrode ET1 and the second electrode ET2 may be connected to different regions of the active layer ACT. For example, the first electrode ET1 may be connected to the first conductive region CDR1 through a first contact hole CH1, and the second electrode ET2 may be connected to the second conductive region CDR2 through a second contact hole CH2.

According to an embodiment, the first electrode ET1 may be any one of the source and drain electrodes SE and DE of the switching transistor Tsw, and the second electrode ET2 may be the other of the source and drain electrodes SE and DE. For example, when the first electrode ET1 is the source electrode SE of the switching transistor Tsw, the second electrode ET2 may be the drain electrode DE of the switching transistor Tsw. On the contrary, when the first electrode ET1 is the drain electrode DE of the switching transistor Tsw, the second electrode ET2 may be the source electrode SE of the switching transistor Tsw.

In the disclosure, positions of the first electrode ET1 and the second electrode ET2 are not particularly limited, and may be variously changed according to an embodiment. According to an embodiment, at least one of the first electrode ET1 and the second electrode ET2 may be omitted.

For example, when the switching transistor Tsw is directly connected to another circuit element (for example, at least one other transistor, capacitor, and/or the like) through the first conductive region CDR1, the first electrode ET1 may be omitted. The first conductive region CDR1 may be the source electrode SE or the drain electrode DE of the switching transistor Tsw.

Similarly, when the switching transistor Tsw is directly connected to another circuit element through the second conductive region CDR2, the second electrode ET2 may be omitted. The second conductive region CDR2 may be the source electrode SE or the drain electrode DE of the switching transistor Tsw.

Alternatively, the first and/or second conductive regions CDR1 and CDR2 may be regarded as the source and/or drain electrodes SE and DE of the switching transistor Tsw. The first and/or second electrodes ET1 and ET2 may be regarded as wires or electrodes of another circuit element connected to one electrode of the switching transistor Tsw.

As in the above-described embodiments, at least one switching transistor Tsw included in the pixel PXL may be configured as the dual or multi-structure transistor. For example, the switching transistor Tsw may include the first sub transistor and the second sub transistor connected through the common conductive region CSDR.

According to an embodiment, the first sub transistor may include a first active layer including the first channel region CHR1 and the first gate electrode GE1 overlapping the first channel region CHR1. The first sub transistor may include at least one electrode (for example, the first electrode ET1) connected to one region of the first active layer.

The first active layer may include the first conductive region CDR1 and the common conductive region CSDR positioned at both sides of the first channel region CHR1, together with the first channel region CHR1. The first conductive region CDR1 and the common conductive region CSDR may configure the source and drain regions of the first sub transistor.

Similarly, the second sub transistor may include the second active layer including the second channel region CHR2, and the second gate electrode GE2 overlapping the second channel region CHR2. The second sub transistor may include at least one electrode (for example, the second electrode ET2) connected to one region of the second active layer.

The second active layer may include the common conductive region CSDR and the second conductive region CDR2 positioned at both sides of the second channel region CHR2 together with the second channel region CHR2. The common conductive region CSDR and the second conductive region CDR2 may configure the source and drain regions of the second sub transistor.

The conductive pattern CDP may be disposed under the common conductive region CSDR between the sub transistors configuring the switching transistor Tsw of the above-described embodiment to overlap or partially overlap the active layer ACT. Therefore, while the potential of the common conductive region CSDR is stabilized to reduce the transient current, an operation characteristic (for example, a high operation speed) of the switching transistor Tsw may be secured and crosstalk may be prevented.

When the conductive pattern CDP is regarded as a component of the switching transistor Tsw, adjacent sub transistors may share one conductive pattern CDP. The first sub transistor of the switching transistor Tsw (for example, the (3_1)-th transistor T3_1 and/or the (4_1)-th transistor T4_1 of FIGS. 4A to 7D) and the last sub transistor (for example, the (3_2)-th transistor T3_2 or the (3_3)-th transistor T3_3, and/or the (4_2)-th transistor T4_2 or the (4_3)-th transistor T4_3) may include a conductive pattern CDP positioned only one side of each channel region. Therefore, each of the first and last sub transistors may have an asymmetric cross-sectional structure.

Figure 10A:
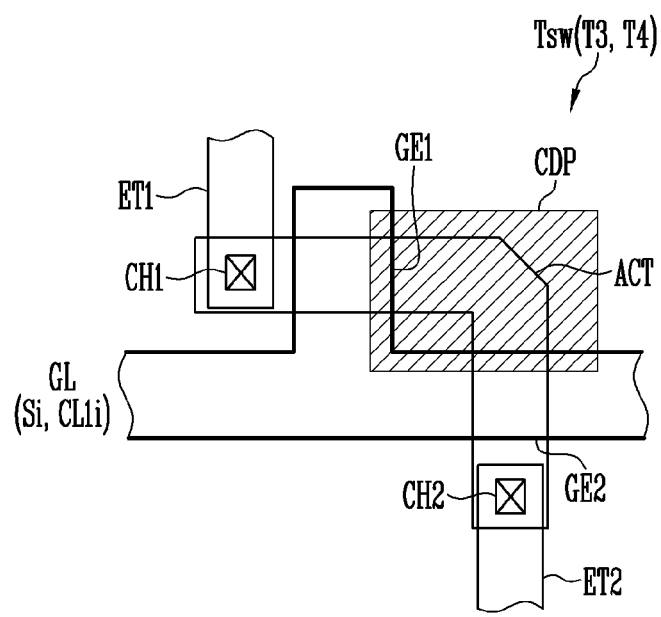
FIGS. 10A to 10D illustrate planar structures of the multi-structure switching transistor according to an embodiment, respectively.
Figure 10B:
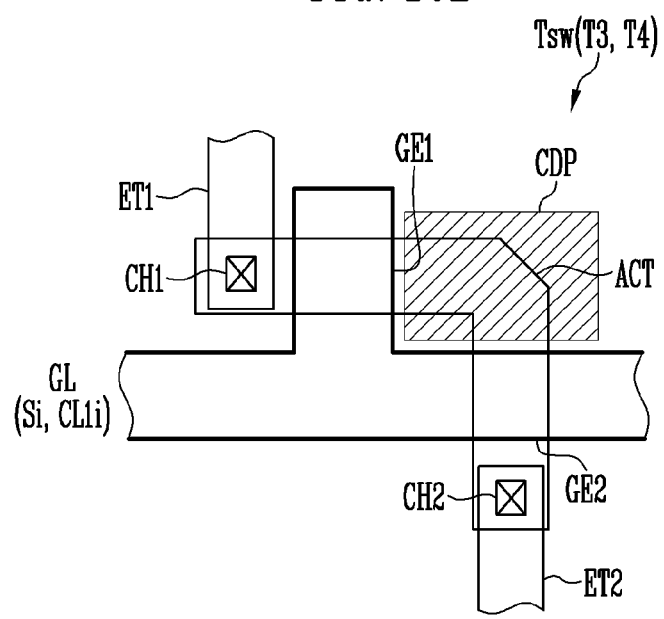
Figure 10C:
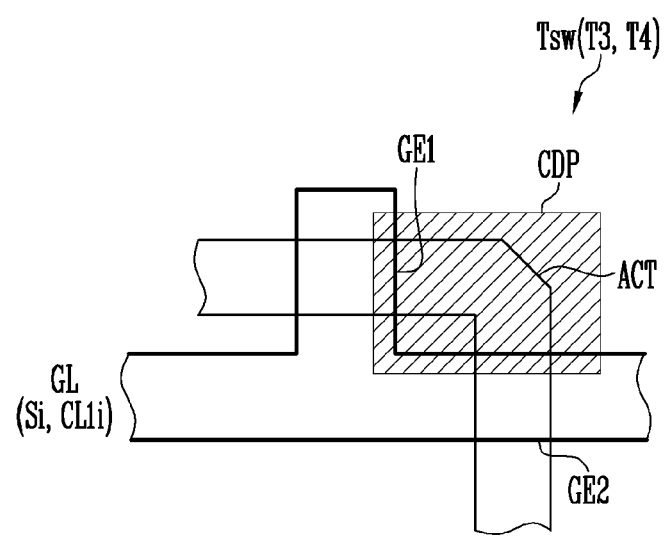
Figure 10D:
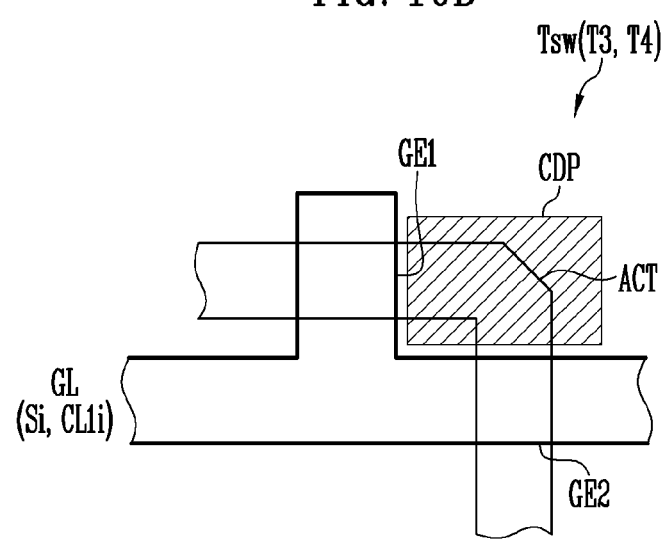

FIGS. 10A to 10D illustrate planar structures for a multi-structure switching transistor Tsw according to an embodiment, respectively. For example, FIGS. 10A and 10B illustrate embodiments of a planar structure corresponding to the switching transistor Tsw according to the embodiments of FIGS. 8 and 9, respectively. FIGS. 10C and 10D illustrate modified embodiments of the switching transistor Tsw according to the embodiments of FIGS. 10A and 10B.

Referring to FIGS. 10A and 10B, the switching transistor Tsw may include the active layer ACT, the first gate electrode GE1 and the second gate electrode GE2 overlapping different regions of the active layer ACT, and the first electrode ET1 and the second electrode ET2 connected to both ends of the active layer ACT. According to an embodiment, the first and second gate electrodes GE1 and GE2 may be commonly connected to the same gate line GL. For example, the first and second gate electrodes GE1 and GE2 may be integrally connected to the gate line GL.

In an embodiment, the switching transistor Tsw may be the third transistor T3 and/or the fourth transistor T4 connected to the first node N1 at each pixel PXL according to the above-described embodiments. When the switching transistor Tsw is the third transistor T3, the gate line GL may be the i-th scan line Si. On the other hand, when the switching transistor Tsw is the fourth transistor T4, the gate line GL may be the i-th first control line CL1i.

The conductive pattern CDP may be disposed under the active layer ACT of the switching transistor Tsw to overlap one region of the active layer ACT.

In an embodiment, the conductive pattern CDP may overlap or partially overlap the first and/or second gate electrodes GE1 and GE2 as shown in FIG. 10A. The first and second channel regions CHR1 and CHR2 of the active layer ACT may be disposed in a region overlapping the first and/or second gate electrodes GE1 and GE2. For example, according to an embodiment, the conductive pattern CDP may overlap one region of the first and/or second channel regions CHR1 and CHR2.

In an embodiment, the conductive pattern CDP may not overlap the first and/or second gate electrodes GE1 and GE2 as shown in FIG. 10B. For example, according to an embodiment, the conductive pattern CDP may have a smaller area than that as illustrated in FIG. 10A (for example, smaller width and/or length) to not overlap the first and second channel regions CHR1 and CHR2.

Referring to FIGS. 10C and 10D, at least one end of the active layer ACT may be directly connected to other circuit elements (for example, an active layer of another adjacent transistor) and/or a wire in the vicinity thereof. In this case, the first and/or second electrodes ET1 and ET2 may be omitted.

The planar structure of the switching transistor Tsw is not limited to the above-described embodiments. For example, in an embodiment, a region of the conductive pattern CDP may be extended so that the conductive pattern CDP may overlap the gate line GL (or the gate electrode GE), the first or second electrodes ET1 and ET2, or a power line. A signal or a voltage of a power source may be supplied to the conductive pattern CDP by connecting the conductive pattern CDP to the gate line GL, the first or second electrodes ET1 and ET2, or the power line.

Figure 11:
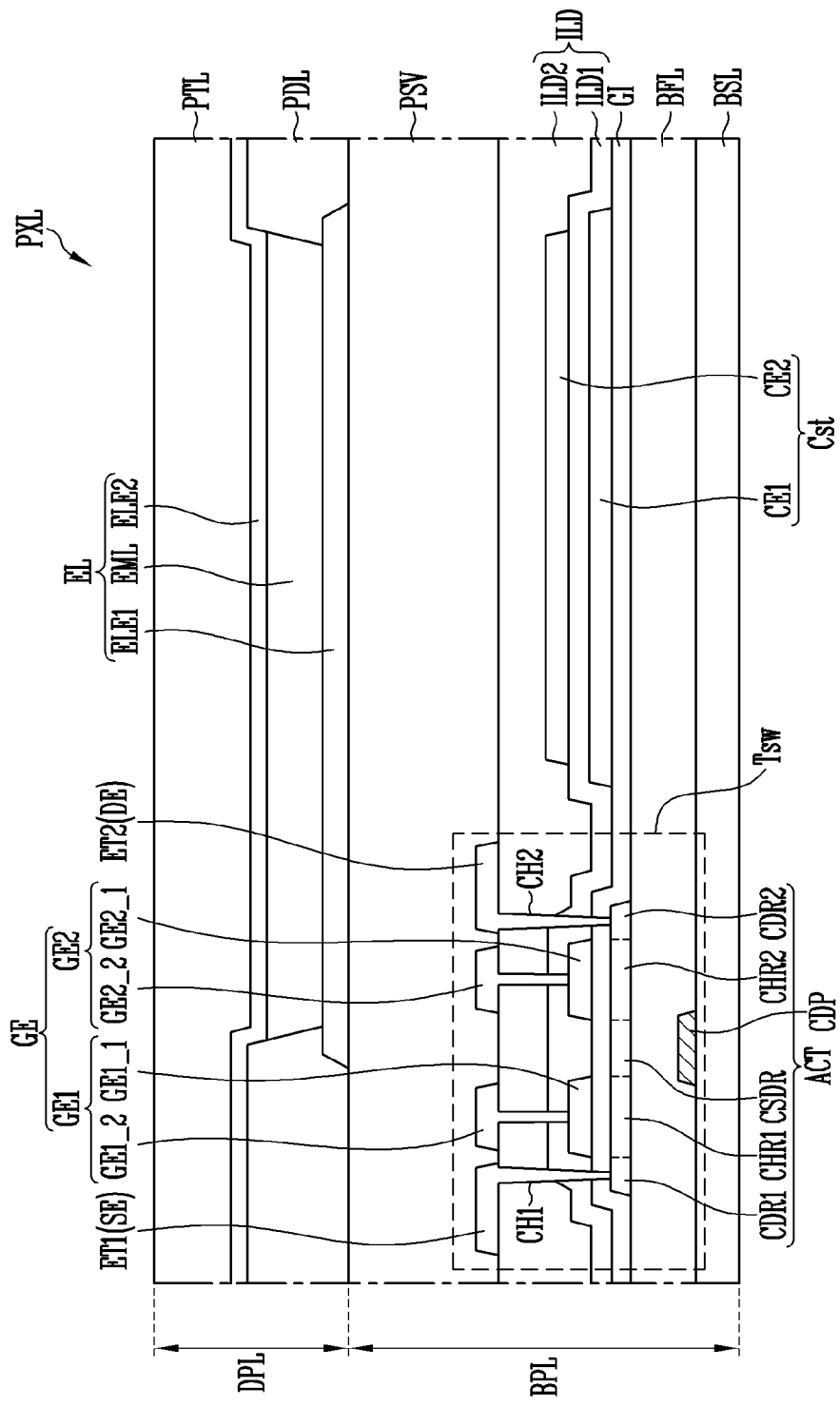
FIG. 11 illustrates a schematic cross-sectional structure of a pixel according to an embodiment.

FIG. 11 illustrates a schematic cross-sectional structure of a pixel PXL according to an embodiment. For example, FIG. 11 illustrates a schematic cross-section of one region of the pixel PXL including the switching transistor Tsw and the conductive pattern CDP according to the embodiment of FIG. 8. In describing the embodiment of FIG. 11, detailed descriptions of the switching transistor Tsw and the conductive pattern CDP described above will be omitted with respect to the same features that were previously described above.

Referring to FIGS. 1 to 11, the pixel PXL may include circuit elements including the switching transistor Tsw and the storage capacitor Cst, and the light emitting element EL. For example, the pixel PXL and the display panel including the same may include a backplane layer BPL (also referred to as a "circuit element layer" or a "circuit layer") in which the circuit elements of each pixel PXL and wires connected thereto are disposed, a display element layer DPL disposed on the backplane layer BPL and having a region on which the light emitting element EL of each pixel PXL may be disposed.

According to an embodiment, the storage capacitor Cst may include a first capacitor electrode CE1 and a second capacitor electrode CE2 disposed on the same or different layer as any one electrode of the switching transistor Tsw, respectively. For example, the first capacitor electrode CE1 may be disposed on the gate insulating film GI together with the lower electrodes GE1_1 and GE2_1 of the first and second gate electrodes GE1 and GE2, and the second electrode CE2 may be disposed on a layer different than that of the electrodes of the switching transistor Tsw.

For example, the interlayer insulating film ILD may be formed in a multi-layer structure including a first interlayer insulating film ILD1 and a second interlayer insulating film ILD2. The second capacitor electrode CE2 may be disposed between the first interlayer insulating film ILD1 and the second interlayer insulating film ILD2.

In an embodiment, the upper electrodes GE1_2 and GE2_2 of the first and second gate electrodes GE1 and GE2 may be disposed on the interlayer insulating film ILD together with the first and second electrodes ET1 and ET2 of the switching transistor Tsw. However, positions of the first and second gate electrodes GE1 and GE2 may be changed. For example, in an embodiment, the upper electrodes GE1_2 and GE2_2 of the first and second gate electrodes GE1 and GE2 may be disposed between the first interlayer insulating film ILD1 and the second interlayer insulating film ILD2, together with the second capacitor electrode CE2. In an embodiment, the first and second gate electrodes GE1 and GE2 may be formed of electrodes of a single layer including only the lower electrodes GE1_1 and GE2_1 formed on the gate insulating film GI.

In other words, structures, positions, and the like of various circuit elements, wires, and insulating films formed on the backplane layer BPL may be variously changed according to an embodiment. A passivation film PSV may be disposed on the circuit elements and wires.

The passivation film PSV may be configured of a single layer or multiple layers. When the passivation film PSV is provided in multiple layers, each layer may be formed of the same or similar material or different materials. For example, the passivation film PSV may be configured of multiple layers including a first passivation film configured of an inorganic insulating film of at least one layer and a second passivation film configured of an organic insulating film of at least one layer. When the passivation film PSV includes an organic insulating film of at least one layer, a surface of the backplane layer BPL may be substantially flat.

The display element layer DPL may include the light emitting element EL, and may include a bank structure for defining a light emission area (for example, a light emission area of each pixel PXL) in which each light emitting element EL may be disposed, for example, a pixel defining film PDL or the like. A protective film PTL may be disposed on the light emitting element EL and the pixel defining film PDL.

The light emitting element EL may include a first electrode ELE1, a light emitting layer EML, and a second electrode ELE2 sequentially stacked on the passivation film PSV. According to an embodiment, one of the first and second electrodes ELE1 and ELE2 of the light emitting element EL may be an anode electrode, and the other may be a cathode electrode. For example, when the first electrode ELE1 is the anode electrode, the second electrode ELE2 may be the cathode electrode.

The first electrode ELE1 of the light emitting element EL may be disposed on the passivation film PSV, and may be connected to at least one circuit element configuring each pixel circuit PXC through a contact hole which is not shown. For example, the first electrode ELE1 may be connected to one electrode of the sixth and seventh transistors T6 and T7 through a contact hole or a via hole passing through the passivation film PSV.

In each pixel area in which the first electrode ELE1 may be formed, the pixel defining film PDL partitioning the light emission area of the corresponding pixel PXL may be formed. The pixel defining film PDL may be disposed between the light emission areas of the pixels PXL and may have an opening portion that exposes the first electrode ELE1 in the light emission area of each pixel PXL. For example, the pixel defining film PDL may protrude upward from a surface of the base layer BSL on which the first electrode ELE1 and the like are formed or disposed along an outer circumference of the light emission area of each pixel PXL.

The light emitting layer EML may be formed or disposed in each light emission area surrounded by the pixel defining film PDL. For example, the light emitting layer EML may be disposed on an exposed surface of the first electrode ELE1. The light emitting layer EML may include at least light generation layer, and may include at least one command layer in addition to the light generation layer. For example, the light emitting layer EML may have a multi-layer thin film structure including the light generation layer.

For example, the light emitting layer EML may include a light generation layer emitting light of a color, a first common layer disposed between the light generation layer and the first electrode ELE1, and a second common layer disposed between the light generation layer and the second electrode ELE2. According to an embodiment, the first common layer may include at least one of a hole injection layer and a hole transport layer. According to an embodiment, the second common layer may include at least one of a hole blocking layer, an electron transport layer, and an electron injection layer. According to an embodiment, the light generation layer may be individually patterned in correspondence with each light emission area. The first common layer and the second common layer may be entirely formed on the display area DA in which the pixels PXL may be disposed.

The second electrode ELE2 of the light emitting element EL may be formed on the light emitting layer EML. According to an embodiment, the second electrode ELE2 may be entirely formed on the display area DA, but is not limited thereto.

The protective film PTL covering the second electrode ELE2 of the light emitting element EL may be formed on the light emitting element EL. According to an embodiment, the protective film PTL may include an encapsulation layer or an encapsulation substrate disposed on one area (for example, at least the display area DA) of the display panel on which the pixels PXL may be disposed to seal the pixels PXL. For example, the protective film PTL may include a thin film encapsulation layer (TFE). When the thin film encapsulation layer is formed to seal the display area DA, a thickness of the display panel may be reduced and flexibility may be secured while protecting the pixels PXL.

According to an embodiment, the protective film PTL may be formed of a single layer or multi-layer structure. For example, the protective film PTL may be configured of multiple films including at least two inorganic films overlapping each other and at least one organic film interposed or disposed between the inorganic films. However, a structure, a material, or the like of the protective film PTL may be various changed according to an embodiment.

In the disclosure, the structures of the pixel PXL and the display panel including the same are not limited to the embodiment shown in FIG. 11. For example, a type, a structure, and/or the like of the pixel PXL and the display panel including the same may be variously changed according to an embodiment.

Although the spirit and scope of the disclosure has been described in detail in accordance with the above-described embodiments, it should be noted that the above-described embodiments are for the purpose of description and not of limitation. In addition, those skilled in the art may understand that various modifications are possible within the spirit and scope of the disclosure.

The scope of the disclosure is not limited to the details described in the detailed description of the specification, but should be defined by the claims. In addition, it is to be construed that all changes or modifications derived from the meaning and scope of the claims and equivalent embodiments thereof are included in and/or within the scope of the disclosure.

What is claimed is:

1. A display device comprising:
a substrate;
a pixel disposed on and above a main surface of the substrate and in a display area, the pixel comprising:
a light emitting element, the light emitting element being electrically connected between a first power source and a second power source;
a first transistor electrically connected between the first power source and the light emitting element and controlling a driving current flowing through the light emitting element in response to a voltage of a first node;
a switching transistor electrically connected to the first node and including an active layer, the active layer comprising:
first and second conductive regions spaced apart from each other;
a first channel region and a second channel region spaced apart from each other and disposed between the first and second conductive regions; and
a common conductive region disposed between the first and second channel regions; a conductive pattern that overlaps a center of the common conductive region of the active layer in plan view, the center being a plane within the common conductive region that is equal distant between a first boundary between the conductive pattern and the first channel region and a second boundary between the conductive pattern and the second channel region, plan view being from a direction perpendicular to the main surface of the substrate;
a first gate electrode overlapping the first channel region, and a second gate electrode overlapping the second channel region, the second gate electrode not overlapping the first gate electrode in plan view; and
the conductive pattern does not overlap both of the first and second channel regions.

2. The display device according to claim 1, wherein the conductive pattern is disposed under the active layer to overlap the common conductive region.

3. The display device according to claim 1, wherein the conductive pattern is disposed not to overlap the first and second conductive regions.

4. The display device according to claim 1, wherein the conductive pattern is disposed not to overlap at least one of the first and second channel regions.

5. The display device according to claim 1, wherein the switching transistor comprises a plurality of sub transistors including a first sub transistor and a second sub transistor electrically connected in series with each other.

6. The display device according to claim 5, wherein
the first sub transistor includes the first conductive region, the first channel region, the common conductive region, and a first gate electrode overlapping the first channel region, and
the second sub transistor includes the second conductive region, the second channel region, the common conductive region, and a second gate electrode overlapping the second channel region and electrically connected to the first gate electrode.

7. The display device according to claim 5, wherein the switching transistor comprises at least three sub transistors electrically connected in series with each other.

8. The display device according to claim 7, wherein
the active layer includes at least two common conductive regions disposed between active layers of the at least three sub transistors, and
the pixel includes at least two conductive patterns respectively overlapping the at least two common conductive regions and spaced apart from each other.

9. The display device according to claim 1, wherein the conductive pattern has a substantially symmetrical shape with respect to the common conductive region on a line connecting the first and second conductive regions.

10. The display device according to claim 1, wherein the conductive pattern is electrically isolated.

11. The display device according to claim 1, wherein the conductive pattern is electrically connected to a gate electrode of the switching transistor.

12. The display device according to claim 1, wherein the conductive pattern is electrically connected to a source electrode of the switching transistor.

13. The display device according to claim 1, wherein the conductive pattern is electrically connected to a power source.

14. The display device according to claim 1, wherein the switching transistor comprises at least one of:
- a second transistor electrically connected between a first electrode of the first transistor and a data line and including a gate electrode electrically connected to a scan line;
- a third transistor electrically connected between a second electrode of the first transistor and the first node and including a gate electrode connected to the scan line; and
- a fourth transistor electrically connected between the first node and an initialization power source and including a gate electrode electrically connected to a first control line.

15. The display device according to claim 14, wherein
the third transistor includes the common conductive region, and
the conductive pattern is disposed under the active layer of the third transistor to overlap the common conductive region.

16. The display device according to claim 14, wherein
the fourth transistor includes the common conductive region, and
the conductive pattern is disposed under the active layer of the fourth transistor to overlap the common conductive region.

17. The display device according to claim 1, wherein
the pixel includes a plurality of switching transistors,
a predetermined number of the switching transistors are configured of multi-structure transistors each including the first and second channel regions and the common conductive region, and
the conductive pattern is disposed under the common conductive region of each of the multi-structure transistors.

18. A pixel comprising:
a substrate;
a light emitting element disposed on and above a main surface of the substrate and electrically connected between a first power source and a second power source;
a first transistor electrically connected between the first power source and the light emitting element and controlling a driving current flowing through the light emitting element in response to a voltage of a first node;
a switching transistor electrically connected to the first node, and including an active layer, the active layer comprising:
first and second conductive regions spaced apart from each other;
a first channel region and a second channel region spaced apart from each other and disposed between the first and second conductive regions; and
a common conductive region disposed between the first and second channel regions;
a conductive pattern that overlaps a center of the common conductive region of the active layer in plan view, the center being a plane within the common conductive region that is equal distant between a first boundary between the conductive pattern and the first channel region and a second boundary between the conductive pattern and the second channel region, plan view being from a direction perpendicular to the main surface of the substrate;
a first gate electrode overlapping the first channel region, and a second gate electrode overlapping the second channel region, the second gate electrode not overlapping the first gate electrode in plan view; and
the conductive pattern does not overlap both of the first and second channel regions.

19. The pixel according to claim 18, wherein the conductive pattern is disposed under the active layer to be electrically isolated.

20. The pixel according to claim 18, wherein the conductive pattern is electrically connected to a gate or source electrode of the switching transistor or a power source.

* * * * *